US012581669B2

(12) United States Patent　　　　(10) Patent No.: US 12,581,669 B2
Kwon et al.　　　　　　　　　　　　(45) Date of Patent: Mar. 17, 2026

(54) VERTICAL MEMORY DEVICE

(71) Applicant: Samsung Electronics Co., Ltd., Suwon-si (KR)

(72) Inventors: Yongseok Kwon, Seoul (KR); Youngsik Rho, Changwon-si (KR); Sangwon Park, Seoul (KR); Sungwhan Seo, Hwaseong-si (KR); Dongkyu Lee, Hwaseong-si (KR); Jaeyong Jeong, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 880 days.

(21) Appl. No.: 17/826,944

(22) Filed: May 27, 2022

(65) Prior Publication Data

US 2022/0399401 A1　　Dec. 15, 2022

(30) Foreign Application Priority Data

Jun. 14, 2021　　(KR) ........................ 10-2021-0076996

(51) Int. Cl.
| | |
|---|---|
| *H01L 25/18* | (2023.01) |
| *H01L 23/00* | (2006.01) |
| *H10B 41/27* | (2023.01) |
| *H10B 41/40* | (2023.01) |
| *H10B 43/27* | (2023.01) |
| *H10B 43/40* | (2023.01) |
| (Continued) | |

(52) U.S. Cl.
CPC .............. *H10D 1/40* (2025.01); *H01L 24/80* (2013.01); *H01L 25/18* (2013.01); *H10B 41/27* (2023.02);
(Continued)

(58) Field of Classification Search
CPC ........ H10B 41/42; H10B 41/50; H10B 43/20; H10B 43/30; H10B 43/40; H10B 43/50;
(Continued)

(56) References Cited

U.S. PATENT DOCUMENTS 7,034,653 B2 *　4/2006　Bhattacharya ........... H01C 1/14
257/E27.047
8,110,862 B2　2/2012　Cheng et al.
(Continued)

FOREIGN PATENT DOCUMENTS

KR　1020030095875 A　12/2003
KR　1020060037780 A　5/2006
(Continued)

OTHER PUBLICATIONS

Extended European Search Report issued Jan. 11, 2023 for corresponding EP Patent Application No. 22178985.2.

*Primary Examiner* — Yara B Green
*Assistant Examiner* — Benjamin Michael Kupp
(74) *Attorney, Agent, or Firm* — Muir Patent Law, PLLC

(57) ABSTRACT

A memory device including a first substrate extending in a first direction and a second direction perpendicular to the first direction, the first substrate including a memory cell region and a first peripheral circuit region, and a second substrate, including a second peripheral circuit region, extending in the first and second direction, the second substrate overlapping the first substrate in a third direction perpendicular to the first and second direction. The memory device also including a memory cell array disposed in the memory cell region and including a plurality of vertical channel structures extending in the third direction, a peripheral circuit disposed in the second peripheral circuit region, and a resistor extending in the third direction through the first peripheral circuit region and the second peripheral circuit region. The resistor including a plurality of resistance contact structures overlapping the plurality of vertical channel structures in the first direction.

20 Claims, 24 Drawing Sheets

(51) Int. Cl.
  *H10B 63/00*    (2023.01)
  *H10D 1/40*    (2025.01)

(52) U.S. Cl.
  CPC ............. *H10B 41/40* (2023.02); *H10B 43/27* (2023.02); *H10B 43/40* (2023.02); *H10B 63/34* (2023.02); *H10B 63/845* (2023.02); *H01L 2225/06541* (2013.01)

(58) Field of Classification Search
  CPC ...... H10B 10/15; H10B 63/34; H10B 63/845; H10B 43/27; H10B 41/27; H10B 41/41; H10B 41/40; H10D 1/40; H10D 48/38; H10D 84/811; H10D 84/817; H10D 1/47; H01L 24/80; H01L 25/18; H01L 2224/08145; H01L 2225/06527; H01L 2225/06541; H01L 25/0657; H01L 21/3205
  See application file for complete search history.

(56) References Cited

U.S. PATENT DOCUMENTS

| | | | |
|---|---|---|---|
| 8,796,772 | B2 | 8/2014 | Yeh et al. |
| 9,691,781 | B1 * | 6/2017 | Nishikawa .......... H01L 21/2253 |
| 11,538,780 | B2 * | 12/2022 | Chen ..................... H01L 23/528 |
| 2014/0264525 | A1 | 9/2014 | Takahashi et al. |
| 2017/0162592 | A1 | 6/2017 | Nishikawa et al. |
| 2018/0108727 | A1 | 4/2018 | Lee et al. |
| 2019/0006279 | A1 | 1/2019 | Lee et al. |
| 2019/0189558 | A1 | 6/2019 | Reznicek et al. |
| 2020/0227404 | A1 | 7/2020 | Zang et al. |
| 2021/0013303 | A1 | 1/2021 | Chen et al. |

FOREIGN PATENT DOCUMENTS

| | | |
|---|---|---|
| KR | 1020060039607 A | 5/2006 |
| WO | 2017095494 A1 | 6/2017 |

* cited by examiner

VERTICAL MEMORY DEVICE

CROSS-REFERENCE TO RELATED APPLICATION

This application is based on and claims priority under 35 U.S.C. § 119 to Korean Patent Application No. 10-2021-0076996, filed on Jun. 14, 2021, in the Korean Intellectual Property Office, the disclosure of which is incorporated by reference herein in its entirety.

BACKGROUND

Aspects of the inventive concept relate to a vertical memory device, and more particularly, to a vertical memory device including nonvolatile memory cells stacked in a vertical direction.

In an electronic system requiring data storage, a memory device capable of storing high-capacity data is required, and accordingly, research into a method of increasing the data storage capacity of a memory device has been conducted. For example, as one of the methods of increasing the data storage capacity of the memory device, a vertical memory device including three-dimensionally arranged vertical memory cells instead of two-dimensionally arranged memory cells has been proposed.

SUMMARY

Aspects of the inventive concept provides a memory device including three-dimensionally arranged vertical memory cells in which a resistor of a peripheral circuit is formed as a contact of a vertical structure so that the stability of a circuit operation is ensured and the size of the memory device is reduced.

According to an aspect of the inventive concept, there is provided a memory device including a first substrate extending in a first direction and a second direction perpendicular to the first direction, the first substrate including a memory cell region and a first peripheral circuit region, a second substrate, including a second peripheral circuit region, extending in the first direction and the second direction, the second substrate overlapping the first substrate in a third direction perpendicular to the first direction and the second direction, a memory cell array disposed in the memory cell region and including a plurality of vertical channel structures extending in the third direction, a peripheral circuit disposed in the second peripheral circuit region, and a resistor extending in the third direction through the first peripheral circuit region and the second peripheral circuit region. The resistor including a plurality of resistance contact structures overlapping the plurality of vertical channel structures in the first direction.

According to another aspect of the inventive concept, there is provided a memory device including a first substrate extending in a first direction and a second direction perpendicular to the first direction, the first substrate including a memory cell region, a connection region, and a first peripheral circuit region, a second substrate, including a second peripheral circuit region, extending in the first direction and the second direction, the second substrate overlapping the first substrate in a third direction perpendicular to the first direction and the second direction, a memory cell array disposed in the memory cell region, a plurality of contact structures included in the connection region and extending in the third direction, and a plurality of resistance contact structures extending in the third direction through the first peripheral circuit region and the second peripheral circuit region. The resistivity of a material included in the plurality of resistance contact structures is greater than a resistivity of a material included in the plurality of contact structures.

According to another aspect of the inventive concept, there is provided a memory device including a first substrate extending in a first direction and a second direction perpendicular to the first direction, the first substrate including a memory cell region, a peripheral circuit region, and a connection region disposed between the memory cell region and the peripheral circuit region, a memory cell array disposed in the memory cell region and including a plurality of vertical channel structures extending in a third direction perpendicular to the first direction and the second direction, a peripheral circuit disposed in the peripheral circuit region, a plurality of peripheral transistors disposed in the peripheral circuit region, a plurality of peripheral contact structures disposed in the peripheral circuit region and extending in the third direction, and a resistor disposed in the peripheral circuit region and including a plurality of resistance contact structures extending in the third direction and overlapping the plurality of vertical channel structures and peripheral contact structures in the first direction. The resistivity of a material included in the plurality of resistance contact structures is greater than a resistivity of a material included in the plurality of peripheral contact structures.

BRIEF DESCRIPTION OF THE DRAWINGS

Embodiments of the inventive concept will be more clearly understood from the following detailed description taken in conjunction with the accompanying drawings in which:

FIG. 6 is a cross-sectional view of a configuration taken along the lines A1-A1' and A2-A2' of FIG. 4B and the lines B1-B1' and B2-B2' of FIG. 5;

FIGS. 14 to 16 are cross-sectional views of memory devices according to an embodiment of the inventive concept.

DETAILED DESCRIPTION OF THE EMBODIMENTS

Figure 1:
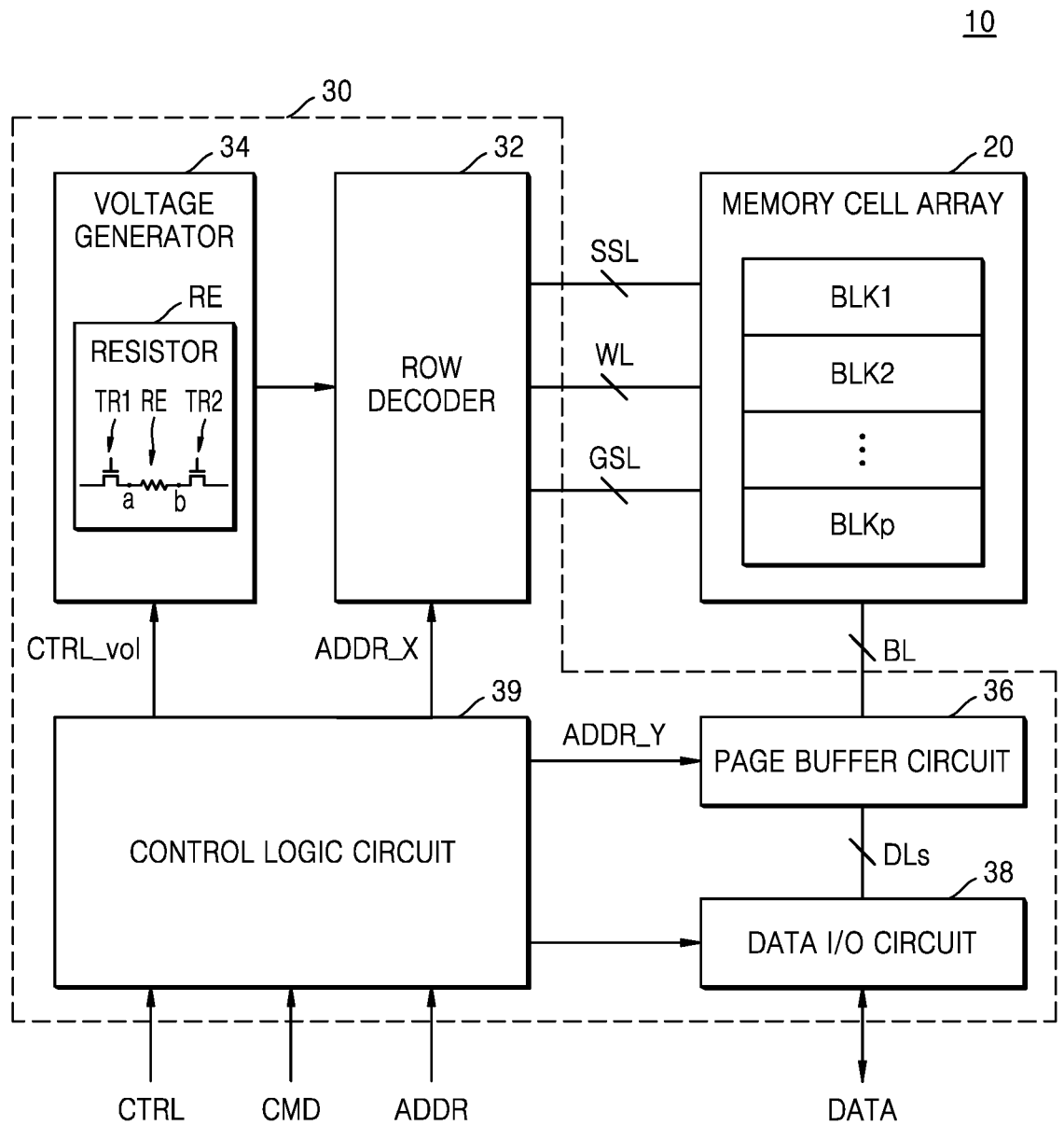
FIG. 1 is a block diagram of a memory device according to an embodiment of the inventive concept.

Hereinafter, embodiments of the inventive concept will be described in detail with reference to the accompanying drawings. The same reference numerals are used for the same components in the drawings, and redundant descriptions thereof are omitted.

FIG. 1 is a block diagram of a memory device 10 according to an embodiment of the inventive concept.

Referring to FIG. 1, the memory device 10 may include a memory cell array 20 and a peripheral circuit 30. The memory cell array 20 may include a plurality of memory cell blocks BLK1, BLK2, . . . , BLKp. Each of the plurality of memory cell blocks BLK1, BLK2, . . . , BLKp may include a plurality of memory cells. The plurality of memory cell blocks BLK1, BLK2, . . . , BLKp may be connected to the peripheral circuit 30 through a bit line BL, a word line WL, a string selection line SSL, and a ground selection line GSL.

The memory cell array 20 may be connected to a row decoder 32 through the word line WL, the string selection line SSL, and the ground selection line GSL, and may be connected to the page buffer circuit 36 through the bit line BL. In the memory cell array 20, each of the plurality of memory cells included in each of the plurality of memory cell blocks BLK1, BLK2, . . . , BLKp may be a flash memory cell. The memory cell array 20 may include a three-dimensional (3D) memory cell array. The 3D memory cell array may include a plurality of NAND strings, each of which may include a plurality of memory cells respectively connected to a plurality of vertically stacked word lines WL.

The peripheral circuit 30 may receive an address ADDR, a command CMD, and a control signal CTRL from the outside of the memory device 10, and may transmit and receive data DATA to and from a device outside the memory device 10. The peripheral circuit 30 may include a row decoder 32, the voltage generator 34, the page buffer circuit 36, a data input/output circuit 38, and a control logic circuit 39. The peripheral circuit 30 may further include various circuits such as an error correction circuit correcting errors in data read from the memory cell array 20, an input/output interface, etc.

The row decoder 32 may select at least one of the plurality of memory cell blocks BLK1, BLK2, . . . , BLKp in response to a row address ADDR_X, and may select the word line WL of the selected memory cell block, the string selection line SSL, and the ground selection line GSL. The row decoder 32 may transmit a voltage for performing a memory operation to the word line WL of the selected memory cell block.

The voltage generator 34 may generate various types of voltages to perform program, read, and erase operations on the memory cell array 20 based on a voltage control signal CTRL_vol. Specifically, the voltage generator 34 may generate a word line voltage, for example, a program voltage, a read voltage, a pass voltage, an erase verification voltage, or a program verification voltage. Also, the voltage generator 34 may further generate a string selection line voltage and a ground selection line voltage based on the voltage control signal CTRL_vol.

The page buffer circuit 36 may be connected to the memory cell array 20 through the bit line BL. The page buffer circuit 36 may operate as a write driver during the program operation to apply a voltage according to the data DATA to be stored in the memory cell array 20 to the bit line BL, and may operate as a sense amplifier during the read operation to sense the data DATA stored in the memory cell array 20, in response to a column address ADDR_Y.

The data input/output circuit 38 may be connected to the page buffer circuit 36 through a plurality of data lines DLs. The data input/output circuit 38 may provide the data DATA received from an external memory controller to the page buffer circuit 36 through the data lines DLs or may provide the data DATA received from the page buffer circuit 36 through the data lines DLs to the memory controller. The data input/output circuit 38 may operate according to a control signal from the control logic circuit 39.

The control logic circuit 39 may generate various control signals for programing data to the memory cell array 20, reading data from the memory cell array 20, or erasing data stored in the memory cell array 20, based on the command CMD, the address ADDR, and the control signal CTRL. For example, the control logic circuit 39 may output the row address ADDR_X and the column address ADDR_Y. Accordingly, the control logic circuit 39 may generally control various operations in the memory device 10.

The peripheral circuit 30 may include a resistor RE connected between a first node a and a second node b. For example, the resistor RE may be connected between a first transistor TR1 and a second transistor TR2. The resistor RE may include a resistance contact structure formed to extend in a direction perpendicular to a vertical level from a substrate on which a plurality of channel structures (180 of FIG. 6) of the memory cell array 20 are formed, and the resistance contact structure may include a material having a higher resistivity than that of another contact structure connected to the memory cell array 20. Although the resistor RE included in the voltage generator 34 has been described with reference to FIG. 1, the memory device 10 according to the aspects of the inventive concept is not limited thereto. A resistor included in a component other than the voltage generator 34 may also include a resistance contact structure formed to extend in a direction perpendicular to a vertical level at which the plurality of channel structures of the memory cell array 20 are formed. Accordingly, a parasitic resistance of the resistor RE may be reduced, and a separate horizontal pattern for implementing the resistor RE may not be formed. In the memory device 10 according to aspects of the inventive concept, the stability of a circuit operation may be secured and a size of the memory device 10 may be reduced.

Figure 2:
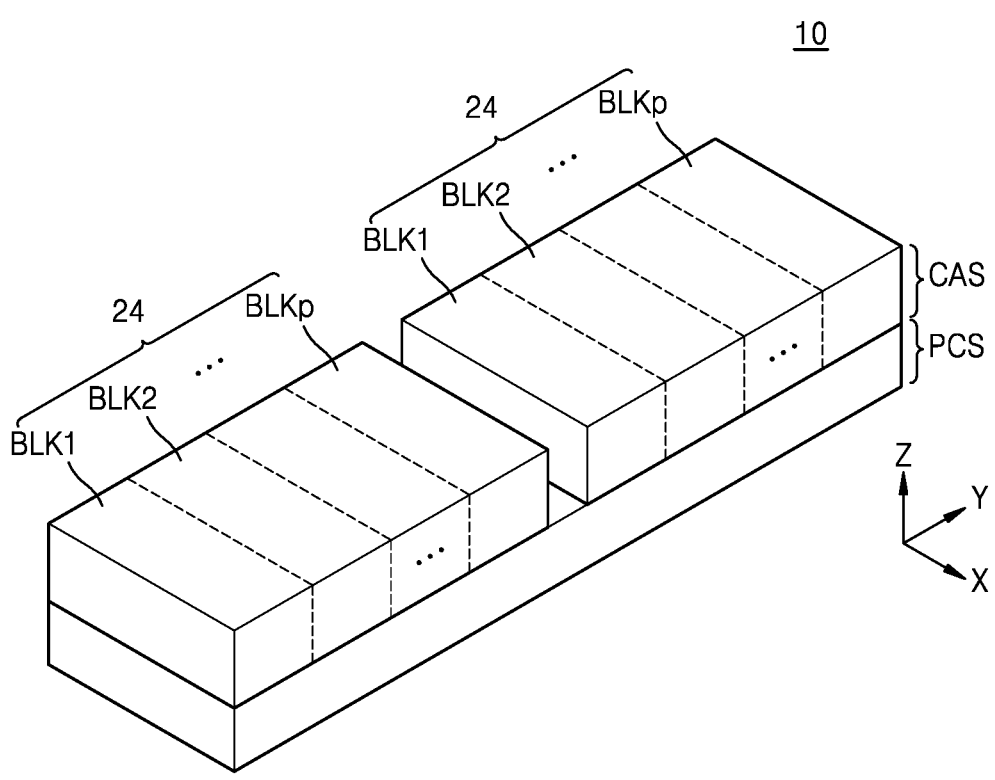
FIG. 2 is a schematic perspective view of a memory device according to embodiments of the inventive concept.

FIG. 2 is a schematic perspective view of the memory device 10 according to embodiments of the inventive concept.

Referring to FIG. 2, the memory device 10 may include a cell array structure CAS and a peripheral circuit structure PCS overlapping each other in a vertical direction (Z direction). The cell array structure CAS may include the memory cell array 20 described with reference to FIG. 1. The peripheral circuit structure PCS may include a part of the peripheral circuit 30 described with reference to FIG. 1.

The cell array structure CAS may include a plurality of tiles 24. Each of the plurality of tiles 24 may include the plurality of memory cell blocks BLK1, BLK2, . . . , BLKp. Each of the plurality of memory cell blocks BLK1, BLK2, . . . , BLKp may include a plurality of 3D arranged memory cells.

In embodiments, two tiles 24 may constitute one mat, but are not limited thereto. The memory cell array 20 described with reference to FIG. 1 may include a plurality of mats, for example, four mats, but is not limited thereto.

However, in the memory device 10 according to the aspects of the inventive concept, the cell array structure CAS and the peripheral circuit structure PCS are not limited to overlapping each other in the vertical direction, and the cell array structure CAS and the peripheral circuit structure PCS may be arranged side by side on the same plane.

Figure 3:
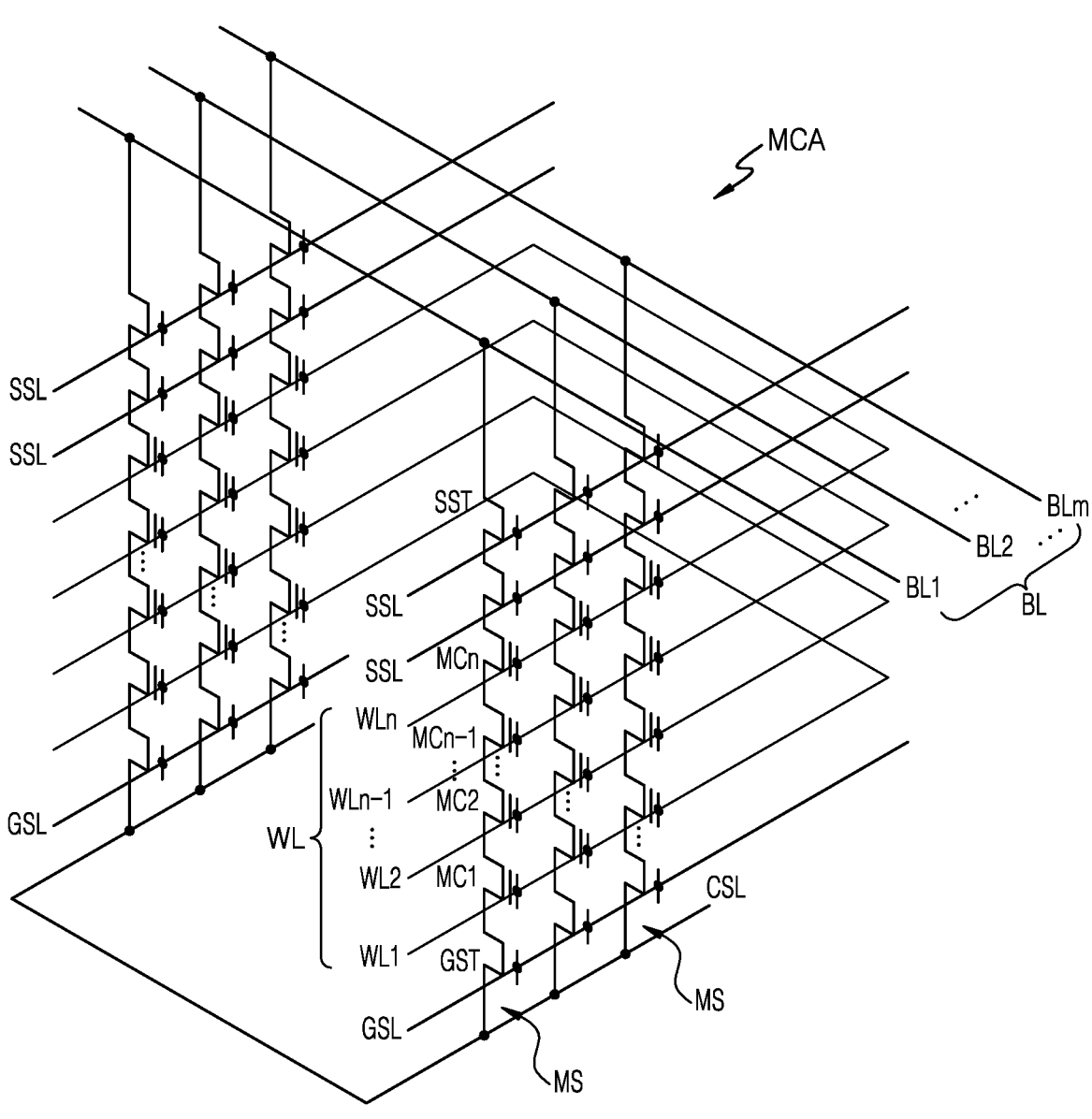
FIG. 3 is an equivalent circuit diagram of a memory cell array of a memory device according to embodiments of the inventive concept.

FIG. 3 is an equivalent circuit diagram of a memory cell array MCA of the memory device 10 according to embodiments of the inventive concept. FIG. 3 is the equivalent circuit diagram of a vertical NAND flash memory device having a vertical channel structure. Each of the plurality of memory cell blocks BLK1, BLK2, . . . , BLKp illustrated in FIGS. 1 and 2 may include the memory cell array MCA having a circuit configuration illustrated in FIG. 3.

Referring to FIG. 3, the memory cell array MCA may include a plurality of memory cell strings MS. The memory cell array MCA may include a plurality of bit lines BL (BL1, BL2, . . . , BLm), a plurality of word lines WL (WL1, WL2, . . . , WLn-1, WLn), at least one string selection line SSL, at least one ground selection line GSL, and a common source line CSL. The plurality of memory cell strings MS may be formed between the plurality of bit lines BL and the common source line CSL. In FIG. 3, each of the plurality of memory cell strings MS may include one ground selection line GSL and two string selection lines SSL, but aspects of the inventive concept is not limited thereto. For example, each of the plurality of memory cell strings MS may include one string selection line SSL.

Each of the memory cell strings MS may include a string selection transistor SST, a ground selection transistor GST, and a plurality of memory cell transistors MC1, MC2, . . . , MCn-1, MCn. A drain region of the string selection transistor SST may be connected to the bit line BL, and a source region of the ground selection transistor GST may be connected to the common source line CSL. The common source line CSL may be a region to which source regions of the plurality of ground selection transistors GST are commonly connected.

The string selection transistor SST may be connected to the string selection line SSL, and the ground selection transistor GST may be connected to the ground selection line GSL. The plurality of memory cell transistors MC1, MC2, . . . , MCn-1, MCn may be respectively connected to the word lines WL.

Figure 4A:
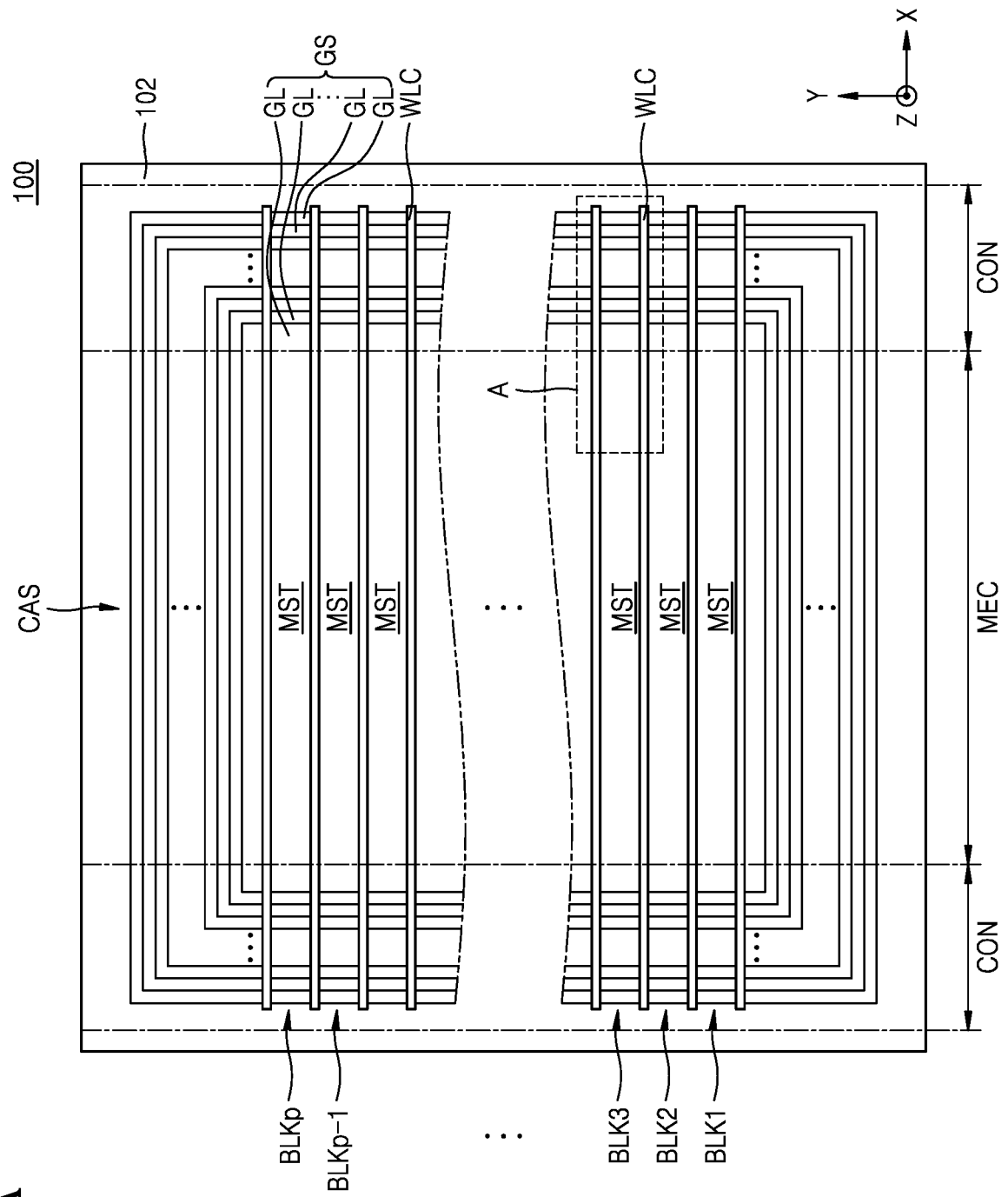
FIG. 4A is a schematic plan view of a partial region of a memory device according to embodiments of the inventive concept.
Figure 4B:
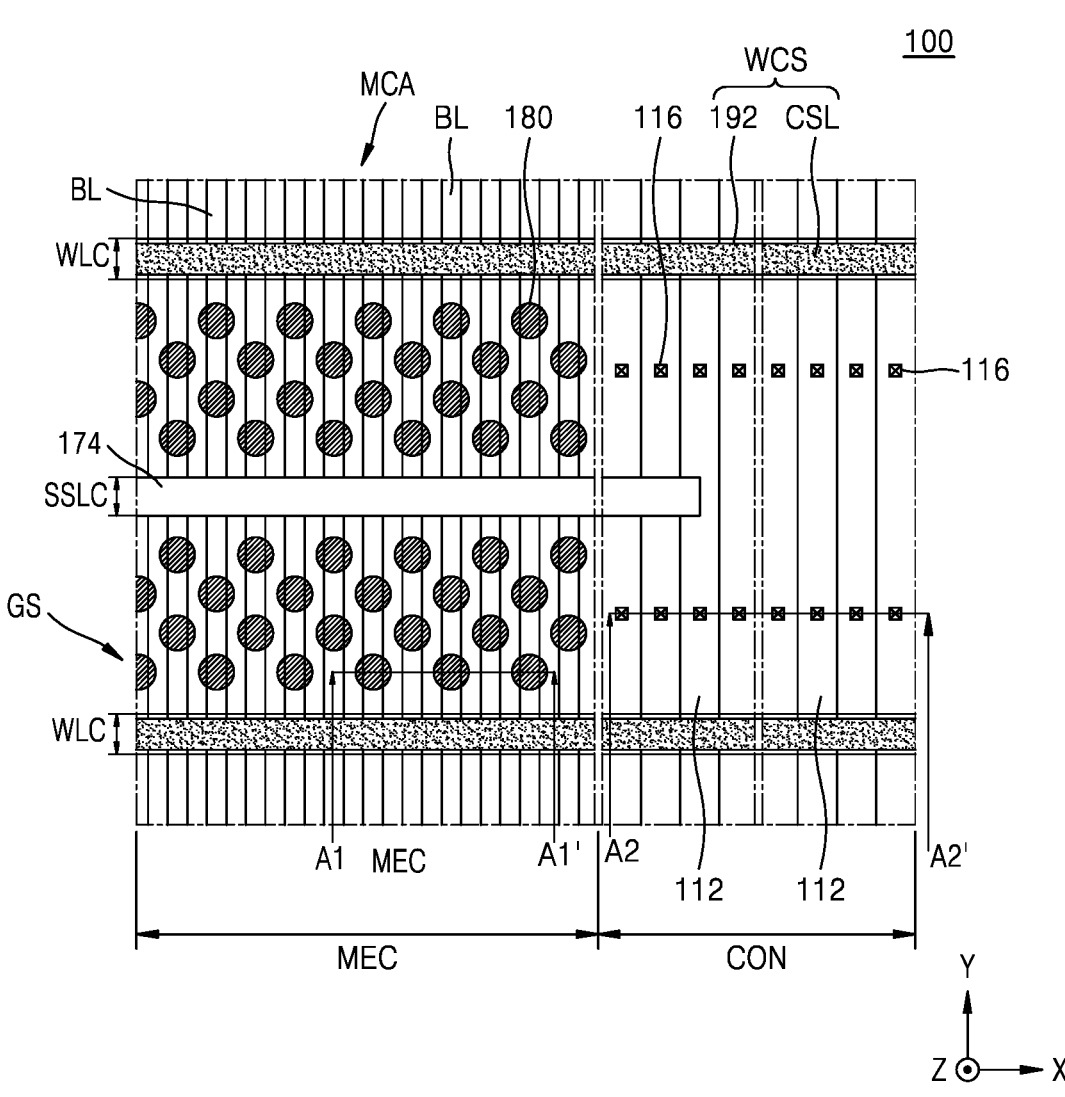
FIG. 4B is an enlarged view of a part A of FIG. 4A.

FIG. 4A is a schematic plan view of a partial region of a memory device 100 in which the cell array structure CAS is formed according to embodiments of the inventive concept. FIG. 4B is an enlarged view of a region A of FIG. 4A.

Referring to FIGS. 4A and 4B, the cell array structure CAS of the memory device 100 may include a substrate 102 and the plurality of memory cell blocks BLK1, BLK2, . . . , BLKp-1, BLKp arranged on the substrate 102. In an embodiment, when the cell array structure CAS and the peripheral circuit structure PCS of the memory device 100 have a vertically overlapping structure, the substrate 102 may be an upper substrate, and the peripheral circuit structure PCS (see FIG. 2) may be disposed below the substrate 102. The plurality of memory cell blocks BLK1, BLK2, . . . , BLKp-1, BLKp may overlap the peripheral circuit structure PCS in the vertical direction (Z direction) with the substrate 102 therebetween. The peripheral circuit structure PCS disposed below the substrate 102 may include the peripheral circuit 30 described with reference to FIG. 1. Alternatively, in an embodiment, when the cell array structure CAS and the peripheral circuit structure PCS of the memory device 100 are arranged side by side in a horizontal direction, the peripheral circuit structure PCS may be disposed above the substrate 102. For example, the peripheral circuit structure may overlap the cell array structure CAS in a horizontal direction (i.e., a direction perpendicular to the Z direction). Spatially relative terms, such as "beneath," "below," "lower," "above," "upper" and the like, may be used herein for ease of description to describe positional relationships, such as illustrated in the figures. It will be understood that the spatially relative terms encompass different orientations of the device in addition to the orientation depicted in the figures.

The cell array structure CAS may include a memory cell region MEC and a connection region CON disposed on both sides of the memory cell region MEC in a first horizontal direction (X direction). Each of the plurality of memory cell blocks BLK1, BLK2, . . . , BLKp-1, BLKp may include a memory stack structure MST extending in the first horizontal direction (X direction) across the memory cell region MEC and the connection region CON. The memory stack structure MST may include a plurality of gate lines GL stacked to overlap each other in the vertical direction (Z direction) in the memory cell region MEC and the connection region CON on the substrate 102. The plurality of gate lines GL may respectively constitute a gate stack GS in a plurality of memory stack structures MST. Each of the plurality of memory stack structures MST may include 48, 64, 96, or 128 gate lines GL stacked in the vertical direction (Z direction), but is not limited thereto.

The plurality of gate lines GL may respectively constitute the ground selection line GSL, the plurality of word lines WL, and the string selection line SSL illustrated in FIG. 3 in the plurality of memory stack structures MST. Areas of the plurality of gate lines GL on an X-Y plane may gradually decrease as a distance from the substrate 102 increases. A central part of each of the plurality of gate lines GL overlapping each other in the vertical direction (Z direction) may constitute the memory cell region MEC, and an edge part of each of the plurality of gate lines GL may constitute the connection region CON. A plurality of word line cut regions WLC extending in the first horizontal direction (X direction) from the memory cell region MEC and the connection region CON may be arranged on the substrate 102. The plurality of word line cut regions WLC may be arranged to be spaced apart from each other in a second horizontal direction (Y direction). The plurality of memory cell blocks BLK1, BLK2, . . . , BLKp-1, BLKp may be arranged between each of the plurality of word line cut regions WLC.

The gate stack GS may include the plurality of gate lines GL and a plurality of conductive pad regions 112 integrally connected to the plurality of gate lines GL. The plurality of conductive pad regions 112 included in the gate stack GS may be arranged in the connection region CON and constitute a stair-type connector 110, and each of the plurality of conductive pad regions 112 may be integrally connected to one gate line GL selected from among the gate lines GL.

A plurality of channel structures 180 may penetrate the gate stack GS and extend in the vertical direction (Z direction) on the memory cell region MEC. Accordingly, the plurality of channel structures 180 may be referred to herein as "vertical channel structures." The plurality of channel structures 180 may be arranged to be spaced apart from each other with a certain gap therebetween in the first horizontal direction (X direction) and the second horizontal direction (Y direction).

The plurality of word line cut regions WLC may extend in the first horizontal direction (X direction) parallel to a main surface of the substrate 102. The plurality of word line cut regions WLC may define a width of the gate stack GS in the second horizontal direction (Y direction) perpendicular to the first horizontal direction (X direction). The gate stacks GS may be repeatedly arranged to be spaced apart from each other at a certain gap by the plurality of word line cut regions WLC, respectively.

The plurality of common source lines CSL may extend in the first horizontal direction (X direction). The plurality of common source lines CSL may be formed to fill a part of the word line cut region WLC at one side of each of the gate stacks GS. In the word line cut region WLC, the common source line CSL may be surrounded by an insulating spacer 192. The common source line CSL and the insulating spacer 192 may constitute a word line cut structure WCS penetrating a memory stack ST.

Two string selection lines (SSL of FIG. 3) adjacent in the second horizontal direction (Y direction) may be spaced apart from each other with a string selection line cut region SSLC therebetween. The string selection line cut region SSLC may be filled with an insulating layer 174. The insulating layer 174 may include an oxide layer, a nitride layer, or a combination thereof. In embodiments, at least a part of the string selection line cut region SSLC may be filled with an air gap.

Each of the plurality of gate lines GL and the plurality of conductive pad regions 112 may include a metal, a conductive metal nitride, or a combination thereof. For example, each the plurality of gate lines GL and the plurality of conductive pad regions 112 may include or may be formed of tungsten, nickel, cobalt, tantalum, tungsten nitride, titanium nitride, tantalum nitride, or a combination thereof, but is not limited thereto.

Figure 5:
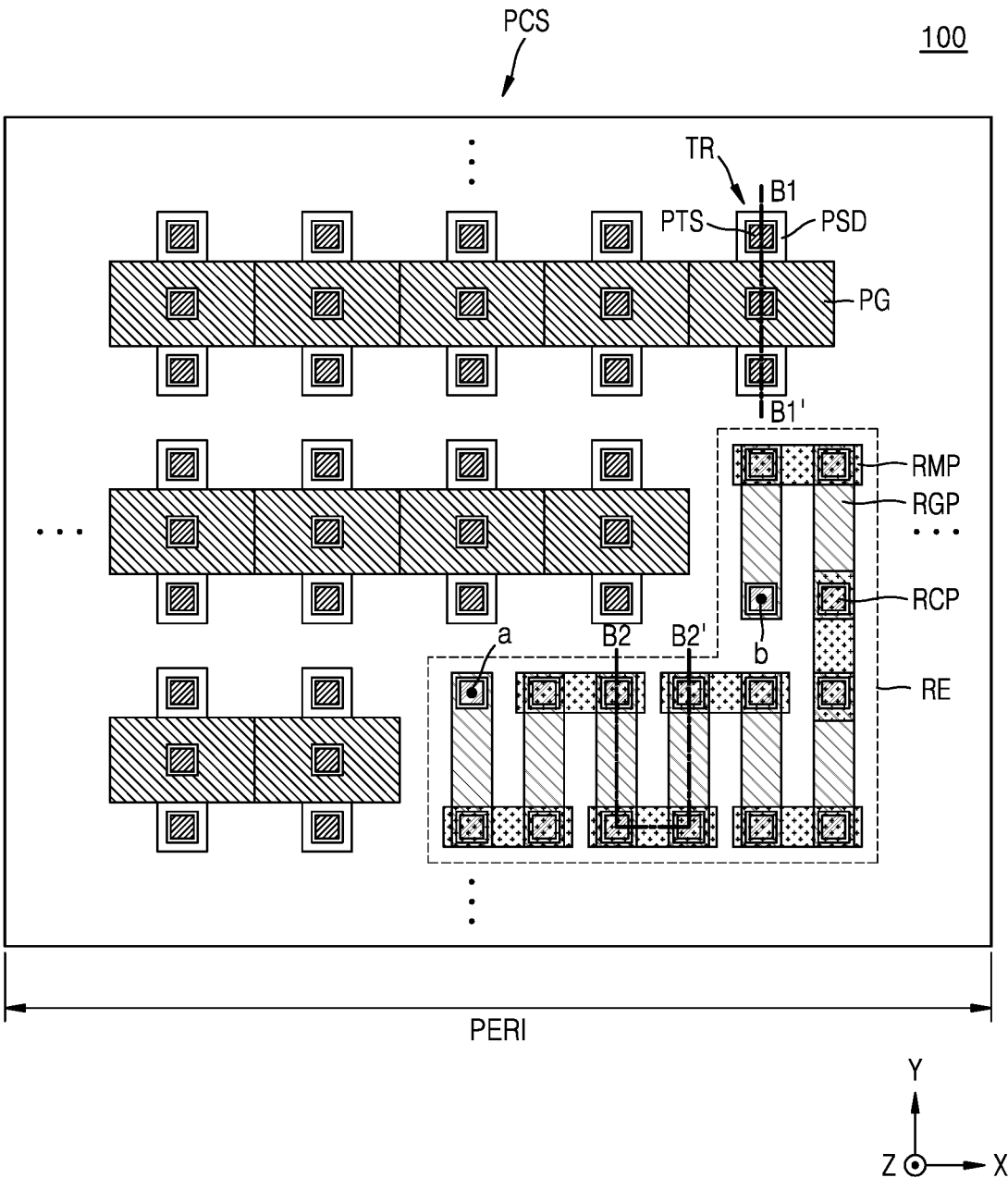
FIG. 5 is a schematic plan view of a partial region of a memory device in which a peripheral circuit structure is formed according to embodiments of the inventive concept.

FIG. 5 is a schematic plan view of a partial region of the memory device 100 in which the peripheral circuit structure PCS is formed according to embodiments of the inventive concept.

Referring to FIG. 5, the peripheral circuit structure PCS may be formed in the peripheral circuit region PERI of the memory device 100. The peripheral circuit structure PCS may include the substrate 102, a plurality of transistors TR, and the resistor RE arranged on the substrate 102. The resistor RE may be connected between the first node a and the second node b. The peripheral circuit structure PCS formed in the peripheral circuit region PERI may include at least some of the row decoder 32, the voltage generator 34, the page buffer circuit 36, the data input/output circuit 38, and the control logic 39 included in the peripheral circuit 30 described with reference to FIG. 1.

A plurality of peripheral transistors TR may be formed in the peripheral circuit region PERI. The peripheral transistor TR may be configured to be electrically connectable to the memory cell region (MEC of FIG. 4A) through a plurality of peripheral contact structures PTS and a wiring structure disposed in the connection region (CON of FIG. 4A). The peripheral transistor TR may include a peripheral gate PG and a peripheral source/drain region PSD. In embodiments, unit devices such as a capacitor may be further disposed in the peripheral circuit region PERI.

The resistor RE may be formed in the peripheral circuit region PERI. The resistor RE may include a plurality of gate patterns RGP, a plurality of resistance contact structures RCP formed to contact the gate patterns RGP, and a plurality of resistance conductive patterns RMP formed to contact the resistance contact structures RCP. The resistor RE may be formed to be connected to some of the plurality of peripheral transistors TR. In an embodiment, the resistor RE may be included in the voltage generator 34 of FIG. 1, but is not limited thereto, and may be included in other components included in the peripheral circuit 30.

In an embodiment, the gate pattern RGP may be formed on a substrate in a horizontal direction. For example, the plurality of gate patterns RGP may be formed to extend in the second horizontal direction (Y direction), and may be formed to be spaced apart from each other in the first horizontal direction (X direction), but are not limited thereto. The gate patterns RGP may be formed to extend in the first horizontal direction (X direction). The gate pattern RGP may be formed at the same level as that of the peripheral gate PG of the peripheral transistor TR, and may include the same material as that of the peripheral gate PG of the peripheral transistor TR. For example, the gate pattern RGP may be formed through the same process as that of the peripheral gate PG of the peripheral transistor TR.

The plurality of resistance contact structures RCP may be formed to extend in the vertical direction (Z direction), and may include a material different from that of the plurality of peripheral contact structures PTS. For example, the plurality of resistance contact structures RCP may include a material having a higher resistivity than that of the plurality of peripheral contact structures PTS. Alternatively, the plurality of resistance contact structures RCP may include a material having a higher resistivity than that of the plurality of contact structures CTS. Accordingly, the resistor RE may be formed to have a resistance value required by the peripheral circuit 30.

The plurality of resistance conductive patterns RMP may be formed on at least some of a plurality of wiring layers. In an embodiment, the plurality of resistance conductive patterns RMP may include a material different from that of conductive patterns of the plurality of wiring layers connected to the plurality of peripheral transistors TR, and, for example, the plurality of resistance conductive patterns RMP may include a material having a relatively high resistivity. However, the memory device 100 according to aspects of the inventive concept is not limited thereto, and the plurality of resistance conductive patterns RMP may include the same material as that of the conductive patterns of the plurality of wiring layers connected to the plurality of peripheral transistors TR.

Figure 6:
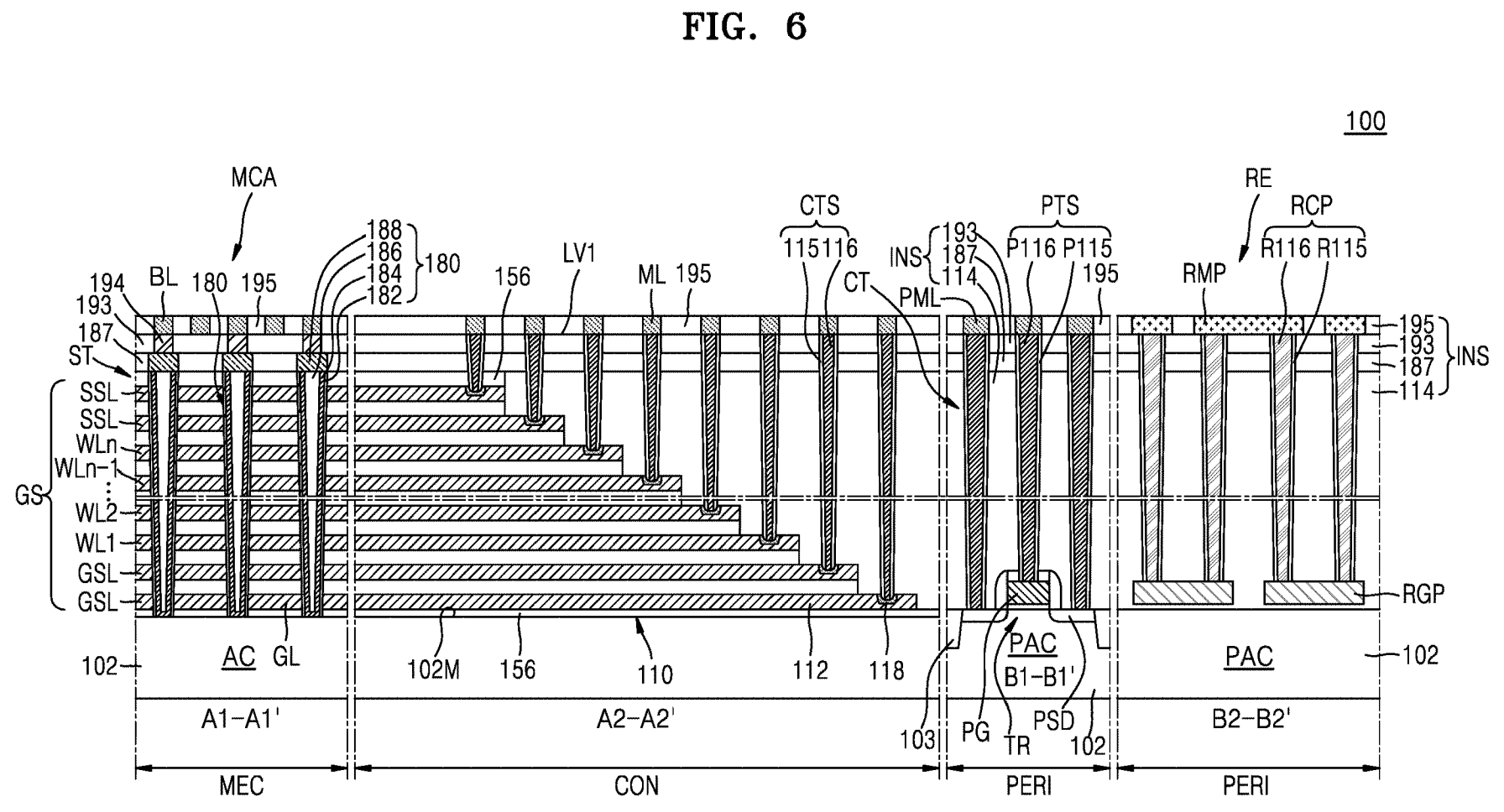

FIG. 6 is a cross-sectional view of a configuration taken along the lines A1-A1' and A2-A2' of FIG. 4B and the lines B1-B1' and B2-B2' of FIG. 5.

Referring to FIG. 6, the memory device 100 may include the substrate 102 including the memory cell region MEC, the connection region CON, and the peripheral circuit region PERI. The substrate 102 may have a main surface 102M extending in a horizontal direction along the X-Y plane. The substrate 102 may include or may be formed of Si, Ge, or SiGe. The memory cell array MCA may be formed on an active region AC of the memory cell region MEC.

The memory stack ST may include 48, 64, 96, or 128 gate lines GL stacked in a vertical direction, but is not limited thereto. The plurality of gate lines GL included in the gate stack GS may be arranged on the memory cell region MEC, extend in the horizontal direction parallel to the main surface 102M of the substrate 102, and overlap each other in the vertical direction. The plurality of gate lines GL may include the plurality of word lines WL (WL1, WL2, . . . , WLn-1, WLn), at least one ground selection line GSL, and at least one string selection line SSL. FIG. 6 illustrates a case in which the plurality of gate lines GL include two ground selection lines GSL and two string selection lines SSL, but aspects of the inventive concept is not limited thereto.

Each of the plurality of gate lines GL and the plurality of conductive pad regions 112 may include a metal, a conductive metal nitride, or a combination thereof. For example, each of the plurality of gate lines GL and the plurality of conductive pad regions 112 may include tungsten, nickel, cobalt, tantalum, tungsten nitride, titanium nitride, tantalum nitride, or a combination thereof, but is not limited thereto.

The insulating layer 156 may be between the substrate 102 and the ground selection line GSL, and between a pair of ground selection lines GSL, the plurality of word lines WL (WL1, WL2, . . . , WLn-1, WLn), and a pair of the string selection lines SSL. Among the plurality of insulating layers 156 on the substrate 102, the insulating layer 156 closest to the substrate 102 may have a smaller thickness than that of the other insulating layers 156. The plurality of insulating layers 156 may include or may be formed of silicon oxide, silicon nitride, or SiON.

The plurality of channel structures 180 may penetrate the plurality of gate lines GL and the plurality of insulating layers 156 and extend in the vertical direction on the memory cell region MEC. The plurality of channel structures 180 may be arranged to be spaced apart from each other with a certain gap therebetween in a first horizontal direction (e.g., the X direction of FIG. 4A) and in a second horizontal direction (e.g., the Y direction of FIG. 4A).

Each of the plurality of channel structures 180 may include a gate dielectric layer 182, a channel region 184, a filling insulating layer 186, and a drain region 188. The channel region 184 may include doped polysilicon and/or undoped polysilicon. The channel region 184 may have a cylindrical shape. An inner space of the channel region 184 may be filled with the filling insulating layer 186. The filling insulating layer 186 may include an insulating material. For example, the filling insulating layer 186 may include or may be formed of silicon oxide, silicon nitride, SiON, or a combination thereof. In embodiments, the filling insulation layer 186 may be omitted, and in this case, the channel region 184 may have a pillar structure having no internal space. The drain region 188 may include polysilicon doped with impurities, metal, conductive metal nitride, or a combination thereof. Examples of the metal constituting the drain region 188 may include tungsten, nickel, cobalt, tantalum, etc.

The plurality of drain regions 188 may be insulated from each other by an intermediate insulating layer 187. Each of the intermediate insulating layers 187 may include an oxide layer, a nitride layer, or a combination thereof.

FIG. 6 illustrates that the channel structure 180 includes the gate dielectric layer 182, and the gate dielectric layer 182 has a shape extending in the vertical direction along the channel region 184, but aspects of the inventive concept is not limited thereto and various modifications and changes may be made.

The plurality of conductive pad regions 112 included in the gate stack GS may be arranged in the connection region CON and constitute the stair-type connector 110. Each of the plurality of conductive pad regions 112 may be integrally connected with one gate line GL selected from among the plurality of gate lines GL.

An insulating layer 114 covering the stair-type connector 110 may be disposed between the substrate 102 and the intermediate insulating layer 187 in the connection region CON. The insulating layer 114 may cover the plurality of conductive pad regions 112. An insulating structure INS may include the insulating layer 114, the intermediate insulating layer 187, and an upper insulating layer 193.

A plurality of contact structures CTS extending in the vertical direction may be arranged above the plurality of conductive pad regions 112 of the stair-type connector 110 in the connection region CON. A plurality of metal silicide layers 118 may be interposed in a plurality of connection portions between the plurality of contact structures CTS and the plurality of conductive pad regions 112. However, unlike the memory device 100 shown in FIG. 6, the plurality of metal silicide layers 118 may not be between the plurality of connection portions between the plurality of contact structures CTS and the plurality of conductive pad regions 112.

Each of the contact structures CTS may include a contact plug 116 extending in the vertical direction and an insulating plug 115 surrounding the contact plug 116. The contact plug 116 of each of the plurality of contact structures CTS may be connected to the conductive pad region 112 of the stair-type connector 110 through the plurality of metal silicide layers 118.

A plurality of wiring layers ML may be disposed above the plurality of contact structures CTS in the connection region CON. The plurality of wiring layers ML may be formed at the same level as that of the plurality of bit lines BL arranged in the memory cell region MEC. Each of the plurality of wiring layers ML may be connected to the contact plug 116 of the contact structure CTS at a first vertical level LV1. Each of the plurality of wiring layers ML may be configured to be electrically connected to one conductive pad region 112 selected from among the plurality of conductive pad regions 112 through one contact plug 116 selected from the plurality of contact plugs 116. The plurality of wiring layers ML may not include a part that vertically overlaps the memory stack ST. The plurality of wiring layers ML in the connection region CON may be insulated from each other by the interlayer insulating layer 195.

Each of the contact plugs 116 and the plurality of wiring layers ML may include or may be formed of tungsten, titanium, tantalum, copper, aluminum, titanium nitride, tantalum nitride, tungsten nitride, or a combination thereof. The plurality of insulating plugs 115 may include a silicon nitride layer, a silicon oxide layer, or a combination thereof.

A plurality of circuits CT may be formed on the peripheral circuit region PERI. The plurality of circuits CT may be formed at the same vertical level as or a higher vertical level than that of the substrate 102. The plurality of circuits CT may include at least some of the row decoder 32, the voltage generator 34, the page buffer circuit 36, the data input/output circuit 38, and the control logic 39 included in the peripheral circuit 30 described with reference to FIG. 1. For example, the plurality of circuits CT may include the peripheral transistor TR and the resistor RE.

A device isolation layer 103 defining a peripheral active region PAC may be formed in the peripheral circuit region PERI of the substrate 102. The peripheral transistor TR may be formed in the peripheral active region PAC. The peripheral transistor TR may constitute some of the plurality of circuits CT formed on the peripheral circuit region PERI. The peripheral transistor TR may be configured to be electrically connectable to the memory cell region MEC through a wiring structure disposed in the connection region CON. The peripheral transistor TR may include the peripheral gate PG and the peripheral source/drain region PSD formed in the peripheral active region PAC at both sides of the peripheral gate PG.

A plurality of peripheral contact structures PTS may be arranged in the peripheral circuit region PERI. The plurality of peripheral contact structures PTS may penetrate the insulating layer 114 and extend from the peripheral transistor TR in the vertical direction (Z direction) to the first vertical level LV1. Each of the peripheral contact structure PTS may include a peripheral contact plug P116 extending in the vertical direction, and a peripheral insulating plug P115 surrounding the peripheral contact plug P116.

A plurality of peripheral wiring layers PML may be arranged on the plurality of peripheral contact plugs P116. The plurality of peripheral wiring layers PML may extend in the horizontal direction at the first vertical level LV1 that is the same level as that of the plurality of wiring layers ML formed in the connection region CON. Each of the plurality of peripheral wiring layers PML may be connected to one of the peripheral gate PG and the peripheral source/drain region PSD through any one of the plurality of peripheral contact plugs P116. At least some of the plurality of peripheral wiring layers PML may be configured to be connected to another circuit or wiring disposed in the peripheral circuit region PERI. For example, at least some of the plurality of peripheral wiring layers PML may be configured such that the peripheral transistor TR is connected to the resistor RE. The plurality of peripheral wiring layers PML may be insulated from each other by the interlayer insulating layer 195.

Each of the plurality of peripheral contact plugs P116 and the plurality of peripheral wiring layers PML may include or may be formed of tungsten, titanium, tantalum, copper, aluminum, titanium nitride, tantalum nitride, tungsten nitride, or a combination thereof. The plurality of peripheral insulating plugs P115 may include a silicon nitride layer, a silicon oxide layer, or a combination thereof.

The resistor RE may be formed in the peripheral active region PAC of the peripheral circuit region PERI. The resistor RE may include the plurality of gate patterns RGP, the plurality of resistance contact structures RCP formed to contact the gate pattern RGP, and the plurality of resistance conductive patterns RMP formed to contact the resistance contact structure RCP. At least two resistance contact structures RCP may contact one gate pattern RGP.

The gate pattern RGP may be formed at the same vertical level as that of the peripheral gate PG of the peripheral transistor TR, and may include the same material as that of the peripheral gate PG of the peripheral transistor TR. For example, the gate pattern RGP may be formed through the same process as that of the peripheral gate PG of the peripheral transistor TR. A doped region such as the peripheral source/drain region PSD may not be formed in the peripheral active region PAC in which the gate pattern RGP is formed.

The plurality of resistance contact structures RCP formed to extend in the vertical direction may be arranged on the gate pattern RGP. The plurality of resistance contact structures RCP may penetrate the insulating layer 114 and extend from the gate pattern RGP to the first vertical level LV1 in the vertical direction. Each of the resistance contact structure RCP may include a resistance contact plug R116 extending in the vertical direction, and a resistance insulating plug R115 surrounding the resistance contact plug R116.

The plurality of resistance contact structures RCP may include a material different from that of the plurality of peripheral contact structures PTS. For example, the plurality of resistance contact structures RCP may include a material having a higher resistivity than that of the plurality of peripheral contact structures PTS. Alternatively, the plurality of resistance contact structures RCP may include a material having a higher resistivity than that of the plurality of contact structures CTS. Accordingly, the resistor RE may be formed to have a resistance value required by the peripheral circuit 30.

The plurality of resistance conductive patterns RMP may be arranged on the plurality of resistance contact structures RCP. The plurality of resistance conductive patterns RMP may extend in the horizontal direction at the first vertical level LV1 that is the same level as the level of the plurality of peripheral wiring layers PML. In an embodiment, the plurality of resistance conductive patterns RMP may include a material different from that of the plurality of peripheral wiring layers PML. For example, the plurality of resistance conductive patterns RMP may include a material having a relatively high resistivity.

The memory device 100 according to aspects of the inventive concept may include the resistor RE including the resistance contact structure RCP formed at a vertical level at which the plurality of channel structures 180 of the memory cell array 20 are formed. That is, the memory device 100 may include the resistance contact structures RCP overlapping the plurality of channel structures 180 in the horizontal direction of the substrate 102, and thus the parasitic resistance of the resistor RE may be reduced, and a separate horizontal pattern for implementing the resistor RE may not be formed. The memory device 100 according to aspects of the inventive concept may secure stability of a circuit operation and reduce its size.

FIGS. 7 to 10 are cross-sectional views illustrating resistors RE1 to RE6 formed in the peripheral circuit region PERI. The resistors RE1 to RE6 described with reference to FIGS. 7 to 10 are modified embodiments of the resistor RE of FIG. 6, and thus, redundant descriptions of the same reference numerals as those of FIG. 6 are omitted.

Figure 7:
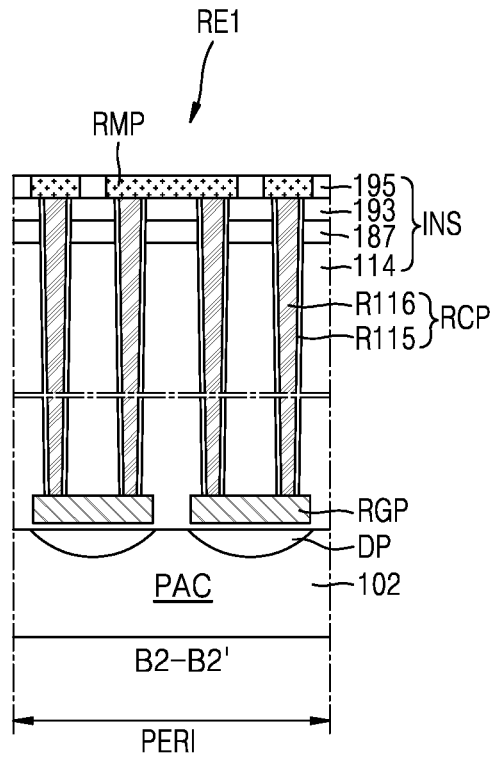
FIGS. 7 to 13 are cross-sectional views illustrating resistors formed in a peripheral circuit region.

Referring to FIG. 7, the resistor RE1 may be formed on the peripheral circuit region PERI. The resistor RE1 may include the plurality of gate patterns RGP, the plurality of resistance contact structures RCP formed to contact the gate pattern RGP, and the plurality of resistance conductive patterns RMP formed to contact the resistance contact structure RCP. A doped region DP may be formed in the peripheral active region PAC in which the gate pattern RGP is formed. For example, the doped region DP may be formed to overlap the gate pattern RGP in a vertical direction. In an embodiment, the doped region DP may be doped with the same impurity as that of the peripheral source/drain region PSD of the peripheral transistor TR, and may be formed through the same process.

Figure 8:
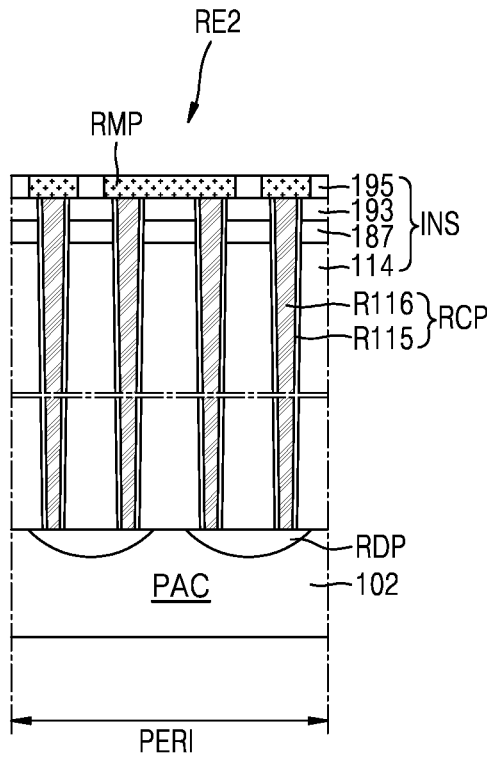

Referring to FIG. 8, the resistor RE2 may be formed on the peripheral circuit region PERI. The resistor RE2 may include a plurality of doped regions RDP, the plurality of resistance contact structures RCP formed to contact the plurality of doped regions RDP, and the plurality of resistance conductive patterns RMP formed to contact the resistance contact structure RCP. In an embodiment, the doped region DP may be doped with the same impurity as that of the peripheral source/drain region PSD of the peripheral transistor TR, and may be formed through the same process. At least two resistance contact structures RCP may contact one doped region RDP.

Figure 9:
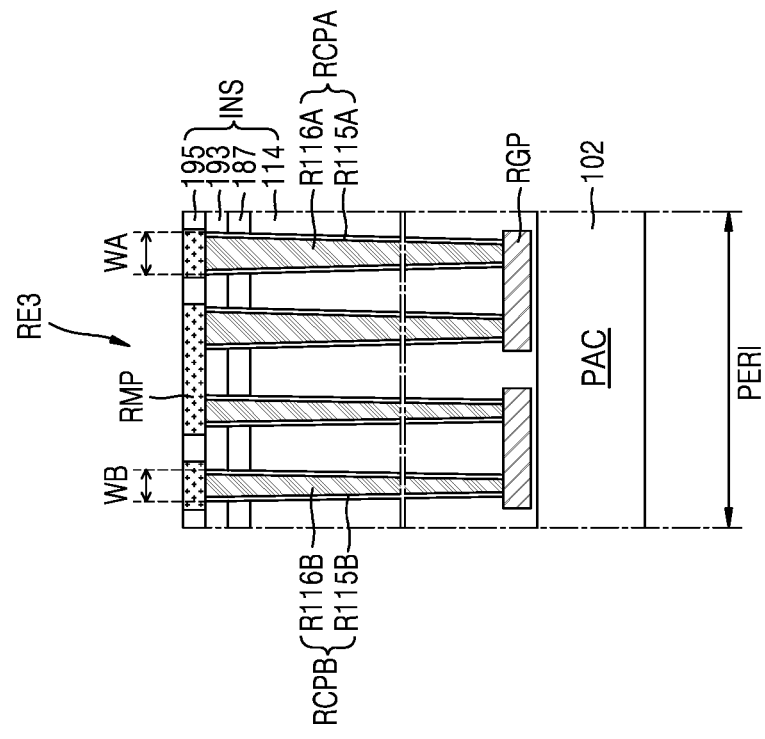

Referring to FIG. 9, the resistor RE3 may be formed on the peripheral circuit region PERI. The resistor RE3 may include the plurality of gate patterns RGP, a plurality of first resistance contact structures RCPA and a plurality of second resistance contact structures RCPB formed to contact the gate pattern RGP, and the plurality of resistance conductive patterns RMP. The plurality of first resistance contact structures RCPA and the plurality of second resistance contact structures RCPB may have different widths. For example, upper surfaces of the plurality of first resistance contact structures RCPA may have a first width WA, upper surfaces of the plurality of second resistance contact structures RCPB may have a second width WB, and the first width WA may be greater than the second width WB.

Also, the resistor RE4 may be formed on the peripheral circuit region PERI. The resistor RE4 may include the plurality of doped regions RDP, the plurality of first resistance contact structures RCPA and the plurality of second resistance contact structures RCPB formed to contact the doped region RDP, and the plurality of resistance conductive patterns RMP. Upper surfaces of the plurality of first resistance contact structures RCPA may have the first width WA, upper surfaces of the plurality of second resistance contact structures RCPB may have the second width WB, and the first width WA may be greater than the second width WB.

Accordingly, the memory device according to aspects of the inventive concept may include the resistor RE3 or RE4 including the resistance contact structures RCPA and RCPB having various widths, and may include the resistor RE3 or RE4 having resistance values of a variety of magnitudes required by the peripheral circuit (30 of FIG. 1).

Figure 10:
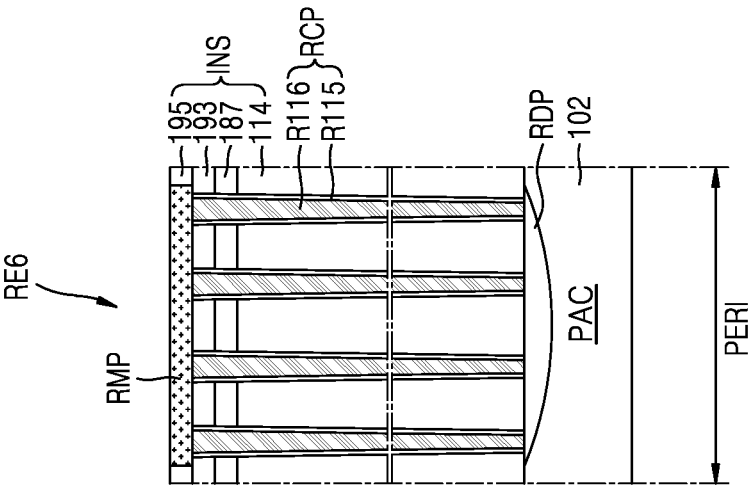
Figure 10:
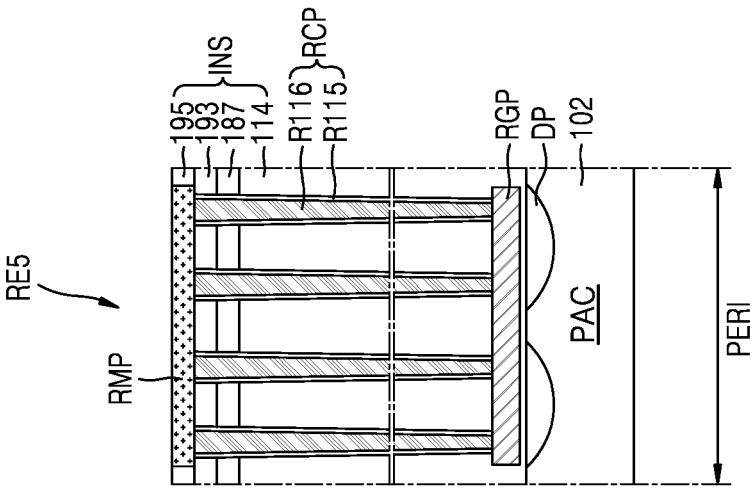

Referring to FIG. 10, the resistor RES may be formed on the peripheral circuit region PERI. The resistor RES may include the plurality of gate patterns RGP, the plurality of resistance contact structures RCP formed to contact the gate pattern RGP, and the plurality of resistance conductive patterns RMP formed to contact the resistance contact structure RCP. Three or more resistance contact structures RCP may contact one gate pattern RGP and one resistance conductive pattern RMP, for example, four resistance contact structures RCP may be formed to contact one gate pattern RGP and one resistance conductive pattern RMP.

The resistor RE6 may be formed on the peripheral circuit region PERI. The resistor RE6 may include the plurality of doped regions RDP, the plurality of resistance contact structures RCP formed to contact the doped region RDP, and the plurality of resistance conductive patterns RMP formed to contact the resistance contact structure RCP. Three or more resistance contact structures RCP may contact one doped region RDP and one resistance conductive pattern RMP, for example, four resistance contact structures RCP may be formed to contact one doped region RDP and one resistance conductive pattern RMP.

Accordingly, the number of resistance contact structures RCP connected to be in contact with the same resistance conductive pattern RMP may be adjusted in various ways, and thus the memory device according to aspects of the inventive concept may include the resistor RE5 or RE6 having resistance values of a variety of magnitudes required by the peripheral circuit (30 of FIG. 1).

Figure 11:
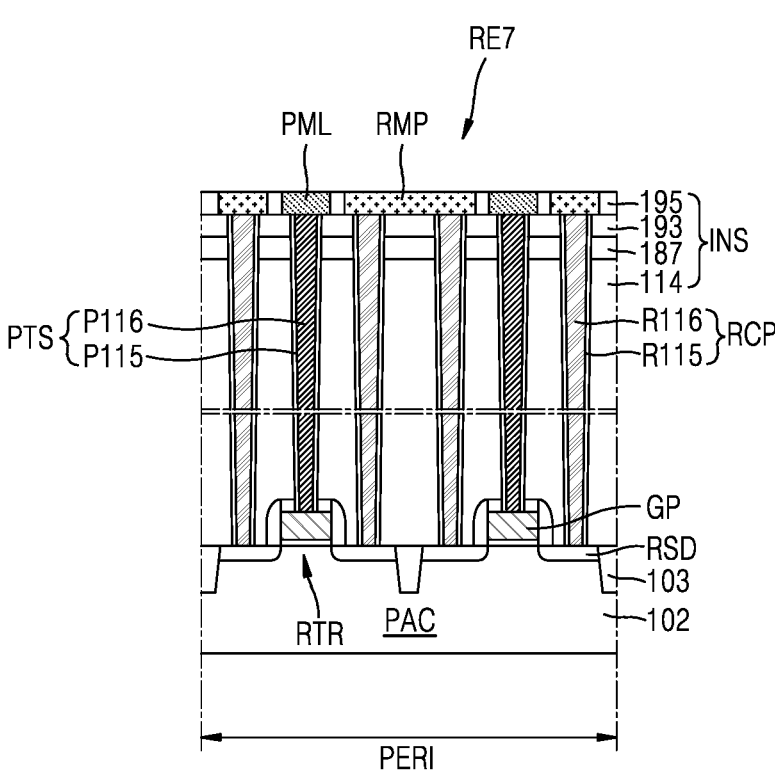
Figure 12:
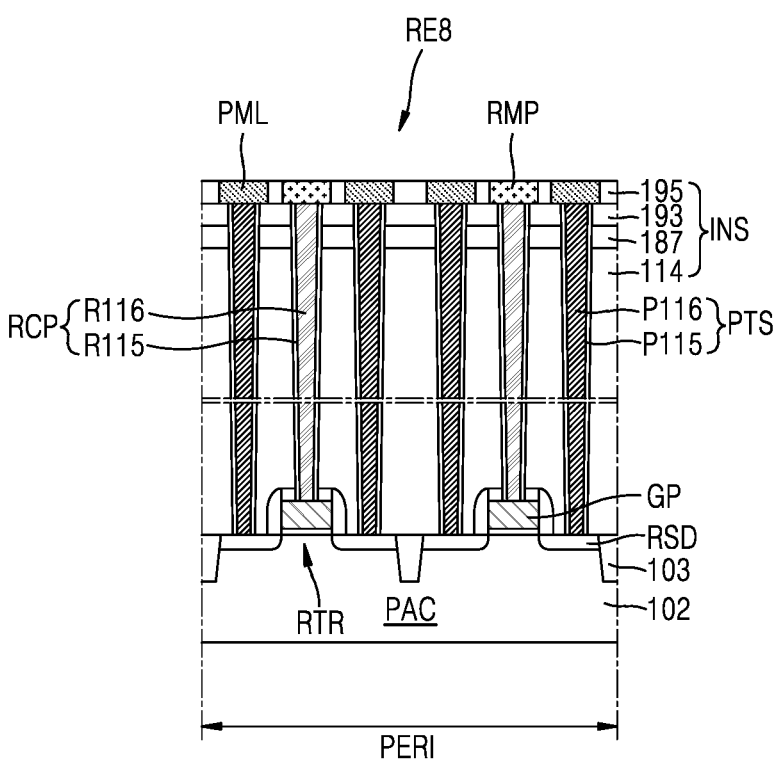

FIGS. 11 and 12 are cross-sectional views illustrating resistors RE7 and RE8 formed in the peripheral circuit region PERI. The resistors RE7 and RE8 described with reference to FIGS. 11 and 12 are modified embodiments of the resistor RE of FIG. 6, and thus, redundant descriptions of the same reference numerals as those of FIG. 6 are omitted.

Referring to FIG. 11, the resistor RE7 may be formed on the peripheral circuit region PERI. The resistor RE7 may include a resistance transistor RTR, the plurality of resistance contact structures RCP formed to contact the source/ drain region RSD of the resistance transistor RTR, and the plurality of resistance conductive patterns RMP formed to contact the plurality of resistance contact structures RCP. In this case, the resistance transistor RTR is a dummy transistor and may function as a conductor transmitting a signal.

In an embodiment, the source/drain region RSD of the resistance transistor RTR may be doped with the same impurity as that of the peripheral source/drain region PSD of the peripheral transistor TR. The resistance transistor RTR may be formed by the same process as that used in the peripheral transistor TR, and the source/drain region RSD of the resistance transistor RTR may be formed by the same process as that used in the peripheral source/drain region PSD of the peripheral transistor TR.

The plurality of resistance contact structures RCP contacting the same source/drain region RSD may be electrically connected to each other through the source/drain region RSD, and the plurality of resistance contact structures RCP contacting different source/drain regions RSD may be electrically connected to each other through the plurality of resistance conductive patterns RMP.

The device isolation layer 103 defining the peripheral active region PAC may be formed in the peripheral circuit region PERI of the substrate 102. The resistance transistor RTR may be formed in the peripheral active region PAC. The gate GP of the resistance transistor RTR may be connected to the peripheral contact structure PTS and may be connected to the peripheral wiring layer PML. A control signal for turning off the resistance transistor RTR may be provided to the gate GP of the resistance transistor RTR through the peripheral wiring layer PML and the peripheral contact structure PTS. For example, when the resistance transistor RTR is an N-type transistor, a logic low control signal may be provided to the gate GP of the resistance transistor RTR.

Referring to FIG. 12, the resistor RE8 may be formed on the peripheral circuit region PERI. The resistor RE8 may include the resistance transistor RTR, the plurality of resistance contact structures RCP formed to contact the gate GP of the resistance transistor RTR, and the plurality of resistance conductive patterns RMP formed to contact the plurality of resistance contact structures RCP.

In an embodiment, the resistance transistor RTR may be formed by the same process as that used in the peripheral transistor TR, and the gate GP of the resistance transistor RTR may be formed by the same process as that used in the peripheral gate PG of the peripheral transistor TR.

The plurality of resistance contact structures RCP contacting the same gate GP may be electrically connected to each other through the same gate GP, and the plurality of resistance contact structures RCP contacting different gates GP may be electrically connected to each other through the plurality of resistance conductive patterns RMP. The peripheral contact structure PTS may be connected to the source/ drain region RSD of the resistance transistor RTR and may be connected to the peripheral wiring layer PML.

Figure 13:
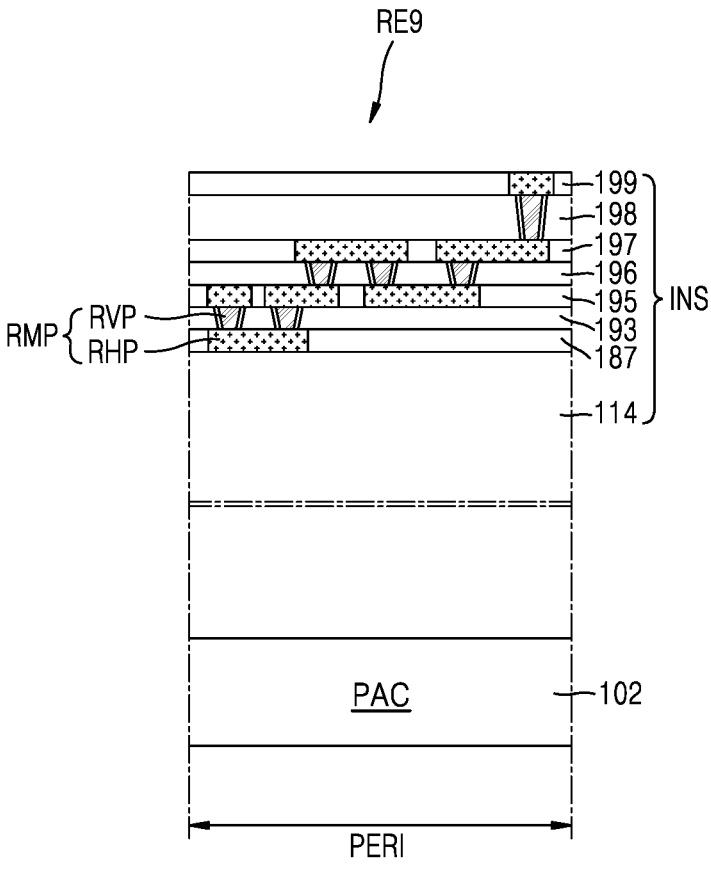

FIG. 13 is a cross-sectional view illustrating a resistor RE9 formed on the peripheral circuit region PERI.

Referring to FIG. 13, the resistor RE9 may be formed on the peripheral circuit region PERI. The resistor RE9 may include the plurality of resistance conductive patterns RMP including a plurality of horizontal patterns RHP and a plurality of vertical patterns RVP. The plurality of horizontal patterns RHP may be formed on a plurality of layers stacked to have different levels in a vertical direction from the substrate 102, and may be insulated from each other by interlayer insulating layers 187, 193, 195, 196, 197, 198, and 199. The plurality of vertical patterns RVP may be formed to penetrate the interlayer insulating layers 193, 196, and 198 to connect the plurality of horizontal patterns RHP formed on different layers.

In an embodiment, the plurality of vertical patterns RVP may include a material different from that of the plurality of peripheral contact structures PTS, and may include the same material as that of the plurality of resistance contact structures RCP. For example, the plurality of vertical patterns RVP may include a material having a higher resistivity than that of the plurality of peripheral contact structures PTS or the plurality of contact structures CTS.

In an embodiment, the plurality of horizontal patterns RHP may include a material different from that of the plurality of peripheral wiring layers PML, and for example, the plurality of vertical patterns RVP may include a material having a relatively high resistivity. However, the memory device according to aspects of the inventive concept is not limited thereto, and the plurality of horizontal patterns RHP may include the same material as that of the plurality of peripheral wiring layers PML.

In an embodiment, the lowermost pattern among the plurality of horizontal patterns RHP or the plurality of vertical patterns RVP may be formed to be in contact with the plurality of resistance contact structures RCP described with reference to FIGS. 6 to 12.

Figure 14:
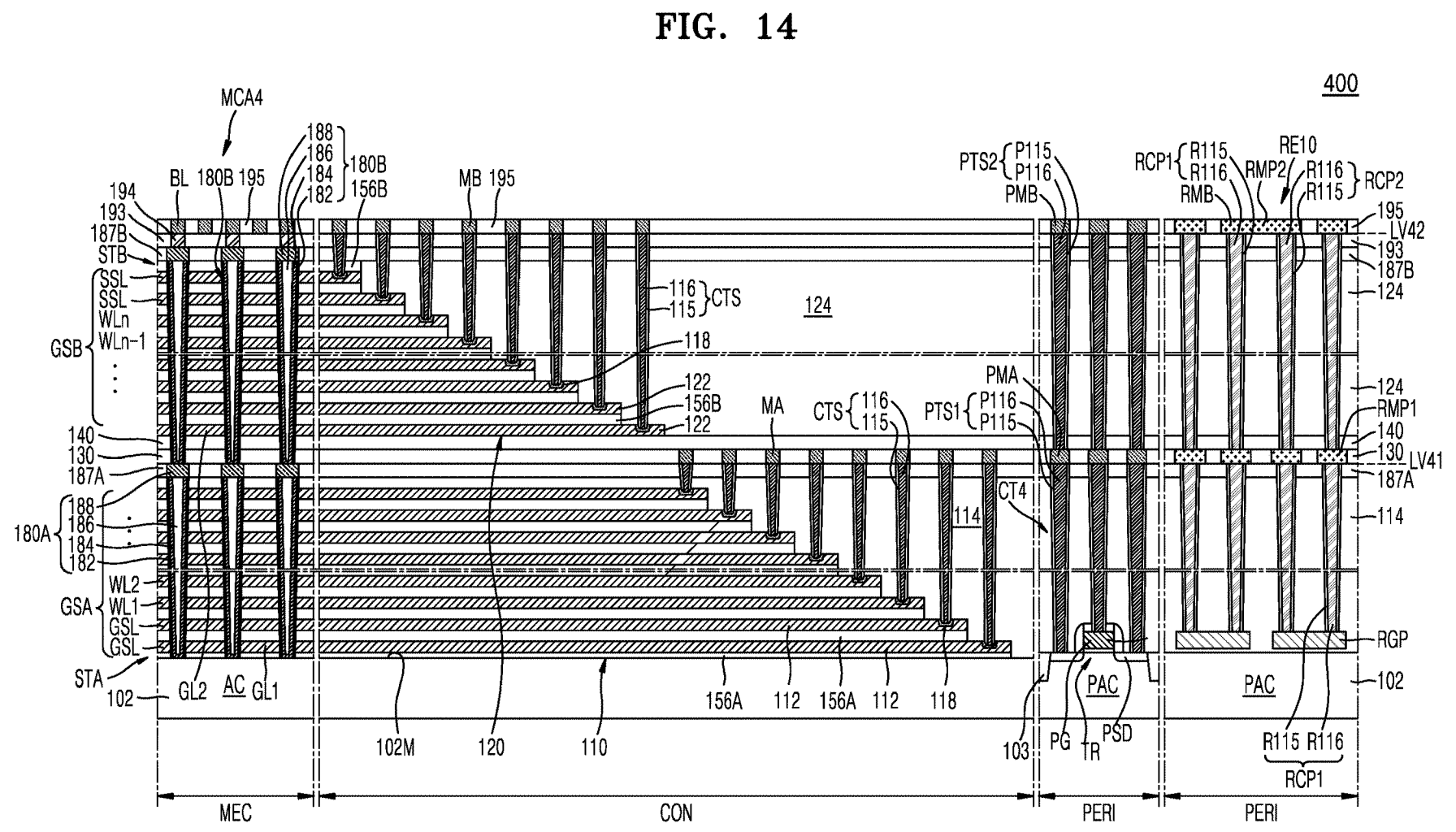
Figure 15:
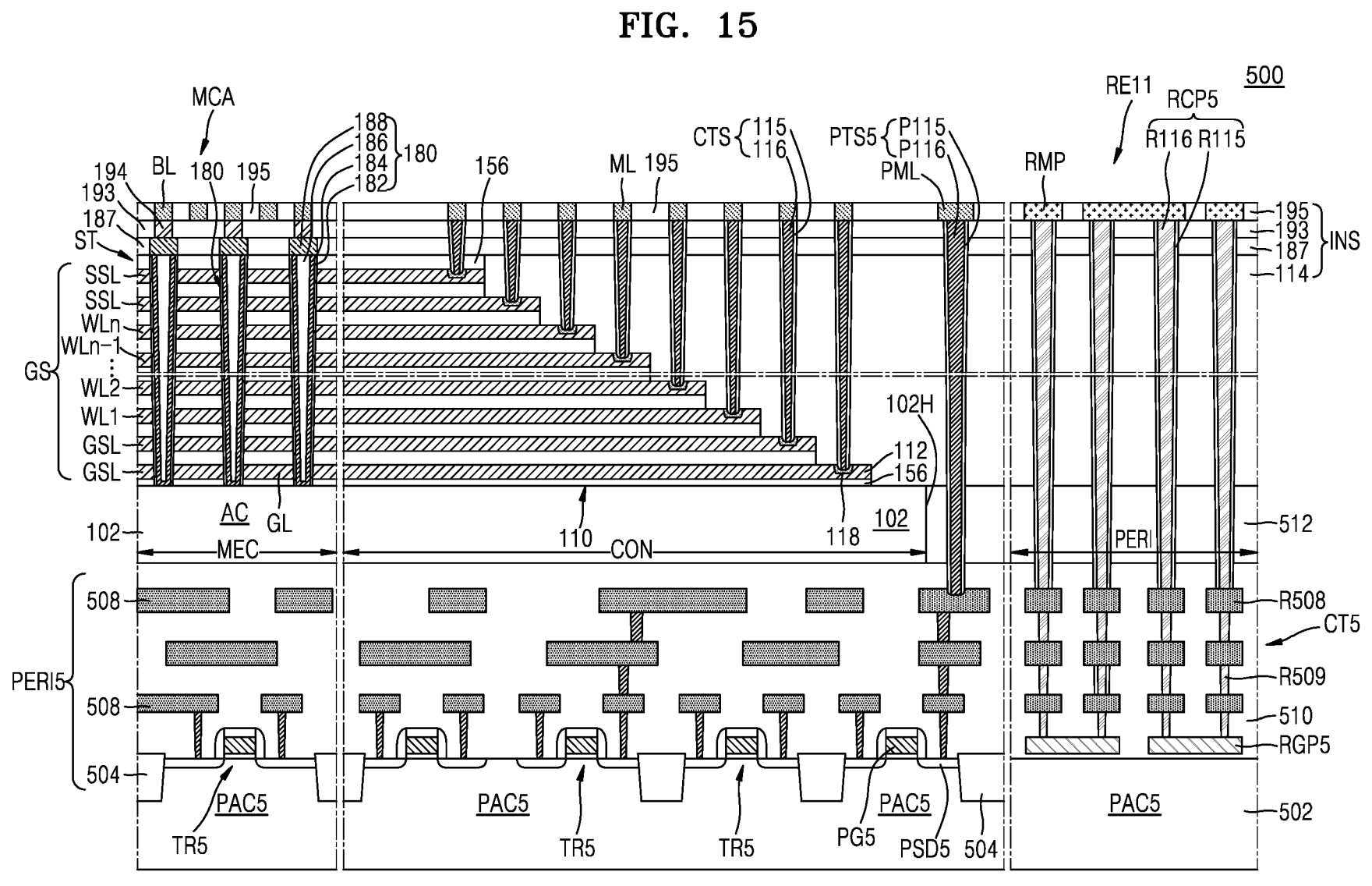
Figure 16:
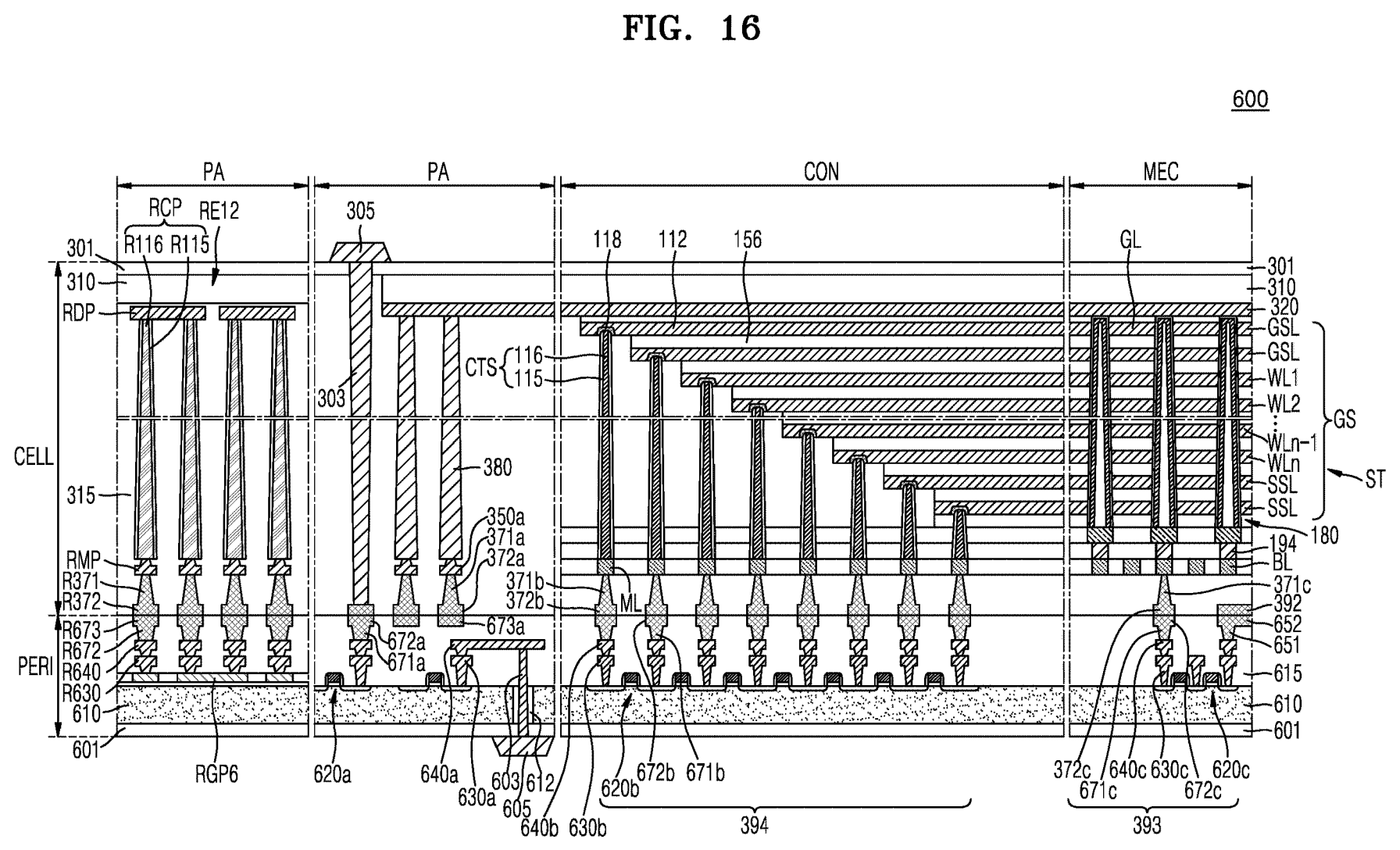

FIGS. 14-16 illustrate, respectively, a cross-sectional view of memory devices 400, 500, and 600 according to an embodiment of the inventive concept. In FIG. 14, the same reference numerals as those in FIG. 6 denote the same members, and redundant descriptions thereof are omitted herein.

Referring to FIG. 14, the memory device 400 may include a memory cell array MCA4 formed on the active region AC of the memory cell region MEC. The memory cell array MCA4 may include a lower memory stack STA and an upper memory stack STB arranged to overlap in the vertical direction on the substrate 102. The upper memory stack STB may be spaced apart from the substrate 102 with the lower memory stack STA therebetween. Accordingly, with respect to the z-direction, the lower memory stack STA may overlap the upper memory stack STB.

A lower gate stack GSA is disposed on the memory cell region MEC and the connection region CON of the substrate 102. The lower gate stack GSA may include a plurality of lower gate lines GL1 and a plurality of conductive pad regions 112 integrally connected to the plurality of lower gate lines GL1. A part of the lower gate stack GSA disposed on the memory cell region MEC may constitute the lower memory stack STA. The plurality of conductive pad regions 112 may be arranged in the connection region CON and constitute the stair type lower connector 110.

An upper gate stack GSB is disposed on the lower gate stack GSA. The upper gate stack GSB may include a plurality of upper gate lines GL2 and a plurality of conductive pad regions 122 integrally connected to the plurality of upper gate lines GL2. A part of the upper gate stack GSB disposed on the memory cell region MEC may constitute the upper memory stack STB. The plurality of conductive pad regions 122 may be arranged in the connection region CON and constitute the stair type upper connector 120.

The plurality of lower gate lines GL1 and the plurality of upper gate lines GL2 may include the plurality of word lines WL (WL1, WL2, . . . , WLn-1, WLn), at least one ground selection line GSL, and, at least one string selection line SSL. FIG. 14 illustrates that two ground selection lines GSL and two string selection lines SSL are included in the plurality of lower gate lines GL1 and the plurality of upper gate lines GL2, but aspects of the inventive concept is not limited thereto. A more detailed configuration of the plurality of lower gate lines GL1 and the plurality of upper gate lines GL2 is the same as that of the gate line GL described with reference to FIG. 6.

Insulating layers 156A and 156B may be between the substrate 102 and the ground selection line GSL, and between a pair of ground selection lines GSL, the plurality of word lines WL (WL1, WL2, . . . , WLn-1, WLn), and a pair of the string selection lines SSL. The plurality of insulating layers 156A and 156B on the substrate 102 may include a plurality of insulating layers 156A constituting the lower memory stack STA and a plurality of insulating layers 156B constituting the upper memory stack STB. Among the plurality of insulating layers 156A constituting the lower memory stack STA, the insulating layer 156A closest to the substrate 102 may have a smaller thickness than that of the other insulating layers 156A. Among the plurality of insulating layers 156B constituting the upper memory stack STB, the insulating layer 156B furthest from the substrate 102 may cover an upper surface of the string selection line SSL farthest from the substrate 102 among the pair of string selection lines SSL. The plurality of insulating layers 156A and 156B may include silicon oxide, silicon nitride, or SiON.

An interlayer insulating layer 130 and an isolation insulating layer 140 may be between the lower memory stack STA and the upper memory stack STB. Each of the interlayer insulating layer 130 and the isolation insulating layer 140 may include a silicon oxide layer.

On the memory cell region MEC, a plurality of channel structures 180A and 180B may penetrate the plurality of lower gate lines GL1, the plurality of insulating layers 156A, the interlayer insulating layer 130, the isolation insulating layer 140, the plurality of upper gate lines GL2, and the plurality of insulating layers 156B and extend in a vertical direction. The plurality of channel structures 180A and 180B may be arranged to be spaced apart from each other with a certain gap therebetween in the horizontal direction.

Each of the plurality of channel structures 180A and 180B may include a lower channel structure 180A penetrating the plurality of lower gate lines GL1 and an upper channel structure 180B penetrating the plurality of upper gate lines GL2. Each of the lower channel structure 180A and the upper channel structure 180B may include the gate dielectric layer 182, the channel region 184, the filling insulating layer 186, and the drain region 188.

The plurality of drain regions 188 constituting the plurality of lower channel structures 180A may be insulated from each other by a lower intermediate insulating layer 187A, and the plurality of drain regions 188 constituting the plurality of upper channel structures 180B may be insulated from each other by the upper intermediate insulating layer 187B. Each of the lower intermediate insulating layer 187A and the upper intermediate insulating layer 187B may include an oxide layer, a nitride layer, or a combination thereof. A lower surface of the upper channel structure 180B may be in contact with an upper surface of the lower channel structure 180A. In the horizontal direction, a width of the lower surface of the upper channel structure 180B may be smaller than a width of the upper surface of the lower channel structure 180A. A more detailed configuration of the plurality of lower channel structures 180A and the plurality of upper channel structures 180B is substantially the same as that of the plurality of channel structures 180 described with reference to FIG. 6.

In the connection region CON, each of the plurality of conductive pad regions 112 constituting the stair type lower connector 110 and the plurality of conductive pad regions 122 constituting the stair type upper connector 120 may have a width gradually decreasing as it moves away from the substrate 102 in a horizontal direction.

In the memory cell region MEC, the plurality of bit lines BL may be arranged on the upper memory stack STB. A plurality of bit line contact pads 194 may be between the plurality of upper channel structures 180B and the plurality of bit lines BL. The drain region 188 of each of the plurality of upper channel structures 180B may be connected to a corresponding one bit line BL among the plurality of bit lines BL through the bit line contact pad 194. The insulating layer 114 covering the stair type lower connector 110 may be disposed between the substrate 102 and the lower intermediate insulating layer 187A in the connection region CON. The insulating layer 114 may cover the plurality of conductive pad regions 112 and the insulating layer 156A.

The upper insulating layer 124 covering the stair type upper connector 120 may be disposed between the isolation insulating layer 140 and the upper intermediate insulating layer 187B in the connection region CON. The upper insulating layer 124 may cover the plurality of conductive pad regions 122 and the insulating layer 156B.

Each of the plurality of contact structures CTS configured to be connected to the plurality of conductive pad regions 112 of the stair type lower connector 110 may penetrate the insulating layer 114 and the lower intermediate insulating layer 187A and extend from the conductive pad region 112 to a first vertical level LV41 higher than the lower memory stack STA and lower than the upper memory stack STB in a direction away from the substrate 102. The contact structure CTS configured to be connected to the conductive pad region 112 furthest from the substrate 102 among the plurality of conductive pad regions 112 may penetrate the insulating layer 156A and the lower intermediate insulating layer 187A and extend from the conductive pad region 112 to the first vertical level LV41.

A plurality of lower wiring layers MA may be formed on the plurality of lower contact plugs 116. The plurality of lower wiring layers MA may be connected to the plurality of contact structures CTS and may extend in a horizontal direction along the first vertical level LV41. The plurality of lower wiring layers MA may be configured to be electrically connectable to at least one lower gate line GL1 selected from among the plurality of lower gate lines GL1 through the plurality of contact structures CTS. The plurality of lower wiring layers MA in the connection region CON may be insulated from each other by the interlayer insulating layer 130.

Each of the plurality of contact structures CTS configured to be connected to the plurality of conductive pad regions 122 of the stair type upper connector 120 may penetrate the upper insulating layer 124, the upper intermediate insulating layer 187B, and the insulating layer 193 and extend from the conductive pad region 122 to a second vertical level LV42 higher than the upper memory stack STB in a direction away from the substrate 102. The contact structure CTS configured to be connected to the conductive pad region 122 furthest from the substrate 102 among the plurality of conductive pad regions 122 may penetrate the insulating layer 156B, the upper intermediate insulating layer 187B, and the insulating layer 193 and extend from the conductive pad region 122 to the second vertical level LV42. The second vertical level LV42 may be higher than a level of an uppermost surface of the plurality of upper channel structures 180B penetrating the upper memory stack STB.

A plurality of upper wiring layers MB may be formed on the plurality of contact structures CTS configured to be connected to the plurality of conductive pad regions 122. The plurality of upper wiring layers MB may be connected to the plurality of contact structures CTS and may extend in a horizontal direction along the second vertical level LV42. The plurality of upper wiring layers MB may be electrically connected to at least one upper gate line GL2 selected from among the plurality of upper gate lines GL2 through the plurality of contact structures CTS and the metal silicide layer 118. The plurality of upper wiring layers MB arranged in the connection region CON may be formed at the same level as that of the plurality of bit lines BL arranged on the memory cell region MEC. The plurality of upper wiring layers MB in the connection region CON may be insulated from each other by the upper interlayer insulating layer 195.

Each of the plurality of contact structures CTS, the plurality of lower wiring layers MA, and the plurality of upper wiring layers MB may include or may be formed of tungsten, titanium, tantalum, copper, aluminum, titanium nitride, tantalum nitride, tungsten nitride, or a combination thereof.

A plurality of circuits CT4 may be formed on the peripheral circuit region PERI. The plurality of circuits CT4 may be formed at the same level as or a higher level than that of the substrate 102. The plurality of circuits CT4 may include the peripheral transistor TR and a resistor RE10. A more detailed configuration of the peripheral transistor TR is substantially the same as that of the peripheral transistor TR described with reference to FIG. 6.

A plurality of lower peripheral contact structures PTS1 may be arranged on the peripheral circuit region PERI. The plurality of lower peripheral contact structures PTS1 may penetrate the insulating layer 114 and extend from the peripheral transistor TR to the first vertical level LV41 in the vertical direction. Each of the plurality of lower peripheral contact structures PTS1 may include a peripheral contact plug P116 extending in the vertical direction and a peripheral insulating plug P115 surrounding the peripheral contact plug P116.

A plurality of lower peripheral wiring layers PMA connected to the plurality of lower peripheral contact structures PTS1 may be arranged on the plurality of lower peripheral contact structures PTS1. The plurality of lower peripheral wiring layers PMA may extend in a horizontal direction at the first vertical level LV41. Each of the plurality of lower peripheral wiring layers PMA may be connected to any one of the peripheral gate PG and the peripheral source/drain region PSD through any one of the plurality of lower peripheral contact structures PTS1. At least some of the plurality of lower peripheral wiring layers PMA may be configured to be connected to another circuit (e.g., the resistor RE10) or wiring disposed in the peripheral circuit region PERI. The plurality of lower peripheral wiring layers PMA may be insulated from each other by the interlayer insulating layer 130.

A plurality of upper peripheral contact structures PTS2 connected to the plurality of lower peripheral wiring layers PMA may be arranged on the plurality of lower peripheral wiring layers PMA. The plurality of upper peripheral contact structures PTS2 may penetrate the isolation insulating layer 140 and the upper insulating layer 124 and extend from the plurality of lower peripheral wiring layers PMA to the second vertical level LV42. Each of the plurality of upper peripheral contact structures PTS2 may include the peripheral contact plug P116 extending in the vertical direction and the peripheral insulating plug P115 surrounding the peripheral contact plug P116.

Alternatively, in an embodiment, not illustrated in FIG. 14, the plurality of lower peripheral contact structures PTS1 and the plurality of upper peripheral contact structures PTS2 may be formed as one peripheral contact structure, and may penetrate the insulating layer 114, the lower intermediate insulating layer 187A, the interlayer insulating layer 130, the isolation insulating layer 140, the upper insulating layer 124, the upper intermediate insulating layer 187B, and the insulating layer 193 and extend from the peripheral transistor TR in a direction away from the substrate 102 to the second vertical level LV42. In this case, the plurality of lower peripheral wiring layers PMA may be omitted.

A plurality of upper peripheral wiring layers PMB connected to the plurality of upper peripheral contact structures PTS2 may be arranged on the plurality of upper peripheral contact structures PTS2. The plurality of upper peripheral wiring layers PMB may extend in the horizontal direction at the second vertical level LV42 that is the same level as that of the plurality of upper wiring layers MB formed in the connection region CON. Each of the plurality of upper peripheral wiring layers PMB may be configured to be connected to another circuit or wiring disposed in the peripheral circuit region PERI. The plurality of upper peripheral wiring layers PMB may be insulated from each other by the interlayer insulating layer 195.

Each of the plurality of lower peripheral wiring layers PMA and the plurality of upper peripheral wiring layers PMB may include or may be formed of tungsten, titanium, tantalum, copper, aluminum, titanium nitride, tantalum nitride, tungsten nitride, or a combination thereof.

The resistor RE10 may be formed in the peripheral active region PAC of the peripheral circuit region PERI. The resistor RE10 may include the plurality of gate patterns RGP, a plurality of lower resistance contact structures RCP1 formed to contact the gate pattern RGP, a plurality of lower resistance conductive patterns RMP1 formed to contact the lower resistance contact structure RCP1, a plurality of upper resistance contact structures RCP2 formed to contact the plurality of lower resistance conductive patterns RMP1, and a plurality of upper resistance conductive patterns RMP2 formed to contact the upper resistance contact structure RCP2. At least two lower resistance contact structures RCP1 may contact one gate pattern RGP.

The gate pattern RGP may be formed at the same vertical level as that of the peripheral gate PG of the peripheral transistor TR, and may include the same material as that of the peripheral gate PG of the peripheral transistor TR. For example, the gate pattern RGP may be formed through the same process as that used in the peripheral gate PG of the peripheral transistor TR. A doped region such as the peripheral source/drain region PSD may or may not be formed in the peripheral active region PAC in which the gate pattern RGP is formed.

The plurality of lower resistance contact structures RCP1 formed to extend in the vertical direction may be arranged on the gate pattern RGP. The plurality of lower resistance contact structures RCP1 may penetrate the insulating layer 114 and extend from the gate pattern RGP to the first vertical level LV41 in the vertical direction.

A plurality of lower resistance conductive patterns RMP1 may be arranged on the plurality of lower resistance contact structures RCP1. The plurality of lower resistance conductive patterns RMP1 may extend in the horizontal direction at the first vertical level LV41 that is the same level as the level of the plurality of lower peripheral wiring layers PMA. The plurality of lower resistance conductive patterns RMP1 may be separated from each other by the interlayer insulating layer 130.

A plurality of upper resistance contact structures RCP2 formed to extend in the vertical direction may be arranged on the lower resistance conductive pattern RMP 1. The plurality of upper resistance contact structures RCP2 may penetrate the upper insulating layer 124 and extend in the vertical direction to the second vertical level LV42.

Alternatively, in an embodiment, not illustrated in FIG. 14, the plurality of resistance contact structures RCP1 and the plurality of upper resistance contact structures RCP2 may be formed as one resistance contact structure, and may penetrate the insulating layer 114, the lower intermediate insulating layer 187A, the interlayer insulating layer 130, the isolation insulating layer 140, the upper insulating layer 124, the upper intermediate insulating layer 187B, and the insulating layer 193 and extend from the gate pattern RGP in a direction away from the substrate 102 to the second vertical level LV42. In this case, the plurality of lower resistance conductive patterns RMP1 may be omitted.

A plurality of upper resistance conductive patterns RMP2 may be arranged on the plurality of upper resistance contact structures RCP2. The plurality of lower resistance conductive patterns RMP2 may extend in the horizontal direction at the second vertical level LV42 that is the same level as the level of the plurality of upper peripheral wiring layers PMB. In an embodiment, as described with reference to FIG. 13, the plurality of upper resistance conductive patterns RMP2 may further include horizontal patterns having a higher vertical level than the second vertical level LV42, and may further include vertical patterns for connecting horizontal patterns having different levels.

The plurality of lower resistance contact structures RCP1 and the plurality of upper resistance contact structures RCP2 may include a material different from that of the plurality of peripheral contact structures PTS. For example, the plurality of lower resistance contact structures RCP1 and the plurality of upper resistance contact structures RCP2 may include a material having a higher resistivity than that of the plurality of peripheral contact structures PTS or the plurality of contact structures CTS. Accordingly, the resistor RE10 may be formed to have a resistance value required by the peripheral circuit (30 in FIG. 1). A more detailed configuration of each of the plurality of lower resistance contact structures RCP1 and the plurality of upper resistance contact structures RCP2 is the same as that of the resistance contact structure RCP described with reference to FIG. 6.

In an embodiment, the plurality of lower resistance conductive patterns RMP1 and the plurality of upper resistance conductive patterns RMP2 may include a material different from that of the plurality of lower peripheral wiring layers PMA or the plurality of upper peripheral wiring layers PMB. For example, the plurality of lower resistance conductive patterns RMP1 and the plurality of upper resistance conductive patterns RMP2 may include a material having a relatively high resistivity. However, the memory device according to aspects of the inventive concept is not limited thereto, and the plurality of lower resistance conductive patterns RMP1 and the plurality of upper resistance conductive patterns RMP2 may include the same material as that of the plurality of lower peripheral wiring layers PMA or the plurality of upper peripheral wiring layers PMB.

In an embodiment, the resistor RE10 may be modified to include characteristics of each of the resistors RE to RE9 described with reference to FIGS. 6 to 13 and formed in the memory device 400. For example, the resistor RE10 may include the doped region (DP of FIG. 7 or RDP of FIG. 8) formed on the substrate 102, the resistance transistor (RTR of FIG. 11 or RTR of FIG. 12) formed on the substrate 102, and the plurality of horizontal patterns (RHP of FIG. 13) and the plurality of vertical patterns (RVP of FIG. 13) formed on the plurality of upper resistance contact structures RCP2.

The resistor RE10 of the memory device 400 according to aspects of the inventive concept may include the plurality of lower resistance contact structures RCP1 formed at a vertical level at which the plurality of lower channel structures 180A of the memory cell array MCA4 are formed, and the plurality of upper resistance contact structures RCP2 formed at a vertical level at which the plurality of upper channel structures 180B of the memory cell array MCA4 are formed.

That is, the memory device 400 may include the plurality of resistance contact structures RCP1 and RCP2 overlapping the plurality of channel structures 180A and 180B in the horizontal direction of the substrate 102, and thus the parasitic resistance of the resistor RE10 may be reduced and a separate horizontal pattern for implementing the resistor RE10 may not be formed. The memory device 400 according to aspects of the inventive concept may secure stability of a circuit operation and reduce its size.

FIG. 15 is a cross-sectional view of the memory device 500 according to an embodiment of the inventive concept. In FIG. 15, the same reference numerals as in FIG. 6 denote the same members, and detailed descriptions thereof are omitted herein.

Referring to FIG. 15, the memory device 500 may have substantially the same configuration as the memory device 100 described with reference to FIG. 6. However, the memory device 500 may include a peripheral circuit region PERI5 formed at a level lower than the level of the substrate 102.

The memory cell region MEC, the connection region CON, and the peripheral circuit region PERI may be arranged to vertically overlap (i.e., in the Z direction) the peripheral circuit region PERI5. For example, the memory cell region MEC, the connection region CON, and the peripheral circuit region PERI may be formed in a first semiconductor layer, and the peripheral circuit region PERI5 may be formed in a second semiconductor layer disposed below the first semiconductor layer. The peripheral circuit region PERI5 may include a peripheral circuit substrate 502 disposed below the substrate 102 and a plurality of circuits CT5 arranged between the peripheral circuit substrate 502 and the substrate 102. Specifically, the plurality of circuits CT5 may include a plurality of peripheral transistors TR5. A more detailed configuration of the peripheral circuit substrate 502 and the peripheral transistor TR5 is substantially the same as that of the substrate 102 and the peripheral transistor TR5 described with reference to FIG. 6.

A peripheral circuit active region PAC5 may be defined on the peripheral circuit substrate 502 by a device isolation layer 504. A plurality of peripheral transistors TR5 may be formed on the peripheral circuit active region PAC5. Each of the plurality of peripheral transistors TR5 may include a peripheral gate PG5 and a peripheral source/drain region PSD5 formed in the peripheral active region PAC5 at both sides of the peripheral gate PG5. A peripheral interlayer insulating layer 510 may be formed on the plurality of peripheral transistors TR5. The peripheral interlayer insulating layer 510 may include or may be formed of silicon oxide, SiON, SiOCN, etc.

The peripheral circuit region PERI5 may include a plurality of peripheral circuit wiring layers 508 and a plurality of peripheral circuit contacts 509. Some of the plurality of peripheral circuit wiring layers 508 may be configured to be electrically connectable to the plurality of peripheral transistors TR5. The plurality of peripheral circuit contacts 509 may be configured to interconnect some of the peripheral circuit wiring layers 508 selected from among the plurality of peripheral circuit wiring layers 508. The plurality of peripheral circuit wiring layers 508 and the plurality of peripheral circuit contacts 509 may be covered with a peripheral interlayer insulating layer 510. Some of the plurality of peripheral circuit wiring layers 508 may face the memory stack ST with the substrate 102 therebetween.

Each of the plurality of peripheral circuit wiring layers 508 and the plurality of peripheral circuit contacts 509 may include or may be formed of a metal, a conductive metal nitride, a metal silicide, or a combination thereof. For example, each of the plurality of peripheral circuit wiring layers 508 and the plurality of peripheral circuit contacts 509 may include or may be formed of a conductive material such as tungsten, molybdenum, titanium, cobalt, tantalum, nickel, tungsten silicide, titanium silicide, cobalt silicide, tantalum silicide, nickel silicide, etc. FIG. 15 illustrates that the plurality of peripheral circuit wiring layers 508 have a wiring structure of three layers in a vertical direction, but aspects of the inventive concept is not limited to that illustrated in FIG. 15. For example, the plurality of peripheral circuit wiring layers 508 may have a multilayer wiring structure of two or more layers or a multilayer wiring structure of four or more layers.

In the memory device 500, a through hole 102H may be formed in the substrate 102. The through hole 102H may be filled with a substrate filling insulating layer 512. The substrate filling insulating layer 512 may include a silicon oxide layer.

In the memory device 500, wiring structures arranged in the connection region CON may be configured to be electrically connected to the plurality of peripheral circuit wiring layers 508 arranged in the peripheral circuit region PERI5 through the peripheral contact structure PTS5 extending in a vertical direction. The peripheral contact structure PTS5 may include the peripheral contact plug P116 extending in the vertical direction, and the peripheral insulating plug P115 surrounding the peripheral contact plug P116. At least some of the plurality of wiring layers ML arranged in the connection region CON and the peripheral wiring layer PML may be configured to be electrically connected to the plurality of peripheral circuit wiring layers 508 arranged in the peripheral circuit region PERI5 through the peripheral contact structure PTS5.

The peripheral contact structure PTS5 may penetrate the peripheral interlayer insulating layer 510 and the substrate filling insulating layer 512 and extend from one peripheral circuit wiring layer 508 selected from among the plurality of peripheral circuit wiring layers 508 to the peripheral wiring layer PML in the vertical direction. The peripheral contact structure PTS5 may penetrate the substrate 102 through a through hole 102H, and may be surrounded by the substrate filling insulating layer 512 in the through hole 102H.

A resistor RE11 may be formed in the peripheral circuit region PERI and the peripheral active region PAC5 of the peripheral circuit region PERI5. The resistor RE11 may include a plurality of gate patterns RGP5, a plurality of lower resistance contacts R509, a plurality of lower resistance patterns R508, a plurality of upper resistance contact structures RCP5, and a plurality of upper resistance conductive patterns RMP. Accordingly, the resistor RE11 may extend through the peripheral circuit region PERI formed in the first semiconductor layer and the peripheral circuit region PERI5 formed in the second semiconductor layer. At least two lower resistance contacts R509 may contact one gate pattern RGP5.

The gate pattern RGP5 may be formed at the same vertical level (i.e., in the Z direction) as that of the peripheral gate PG5 of the peripheral transistor TR5 and may include the same material as that of the peripheral gate PG5 of the peripheral transistor TR5. For example, the gate pattern RGP5 may be formed through the same process as that used in the peripheral gate PG5 of the peripheral transistor TR5. In the lower peripheral circuit active region PAC5 on which the gate pattern RGP5 is formed, a doped region such as the peripheral source/drain region PSD may or may not be formed.

In the peripheral circuit region PERI5, the plurality of lower resistance contacts R509 and the plurality of lower resistance patterns R508 electrically connected to the gate pattern RGP5 may be formed on the gate pattern RGP5. The plurality of lower resistance contacts R509 may be configured to interconnect some selected from among the plurality of lower resistance patterns R508, and the plurality of lower resistance contacts R509 and the plurality of lower resistance patterns R508 may be covered with an insulating layer 510. In an embodiment, the plurality of lower resistance contacts R509 may include a material having a higher resistivity than that of the plurality of peripheral circuit contacts 509 or the plurality of contact structures CTS, and the plurality of lower resistance patterns R508 may include a material having a higher resistivity than that of the peripheral circuit wiring layer 508. However, the memory device according to aspects of the inventive concept is not limited thereto, and the plurality of lower resistance contacts R509 may include the same material as that of the plurality of peripheral circuit contacts 509, and the plurality of lower resistance patterns R508 may include the same material as that of the peripheral circuit wiring layer 508.

The resistor RE11 may include the plurality of upper resistance contact structures RCP5 in contact with the plurality of lower resistance patterns R508. Each of the plurality of upper resistance contact structures RCP5 may include the resistance contact plug R116 extending in the vertical direction and the resistance insulating plug R115 surrounding the resistance contact plug R116.

The upper resistance contact structure RCP5 may penetrate the peripheral interlayer insulating layer 510 and the substrate filling insulating layer 512 and extend (e.g., lengthwise) from the lower resistance pattern R508 selected from the plurality of lower resistance patterns R508 to the plurality of upper resistance conductive patterns RMP in the vertical direction. The upper resistance contact structure RCP5 may penetrate the substrate 102 through the through hole 102H, and may be surrounded by the substrate filling insulating layer 512 in the through hole 102H.

The plurality of upper resistance contact structures RCP5 may include a material different from that of the plurality of peripheral contact structures PTS5. For example, the plurality of upper resistance contact structures RCP5 may include a material having a higher resistivity than that of the plurality of peripheral contact structures PTS5. Accordingly, the resistor RE11 may be formed to have a resistance value required by the peripheral circuit 30. A more detailed configuration of each of the plurality of upper resistance contact structures RCP5 is the same as that of the resistance contact structure RCP described with reference to FIG. 6.

In an embodiment, the resistor RE11 may be modified to include characteristics of each of the resistors RE to RE9 described with reference to FIGS. 6 to 13 and formed in the memory device 500. For example, the resistor RE11 may include the doped region (DP of FIG. 7 or RDP of FIG. 8) formed on the peripheral circuit substrate 502, the resistance transistor (RTR of FIG. 11 or RTR of FIG. 12) formed on the peripheral circuit substrate 502, and the plurality of horizontal patterns (RHP of FIG. 13) and the plurality of vertical patterns (RVP of FIG. 13) formed on the plurality of resistance contact structures RCP5.

The resistor RE11 of the memory device 500 according to aspects of the inventive concept may include the plurality of resistance contact structures RCP5 formed at a vertical level at which the plurality of channel structures 180 of the memory cell array MCA are formed. That is, the memory device 500 may include the plurality of resistance contact structures RCP5 overlapping the plurality of channel structures 180 in the horizontal direction of the substrate 102, and thus the parasitic resistance of the resistor RE11 may be reduced and a separate horizontal pattern for implementing the resistor RE11 may not be formed. The memory device 500 according to aspects of the inventive concept may secure stability of a circuit operation and reduce its size.

FIG. 16 is a cross-sectional view of the memory device 600 according to an embodiment of the inventive concept. In FIG. 16, the same reference numerals as in FIG. 6 denote the same members, and detailed descriptions thereof are omitted herein.

Referring to FIG. 16, the memory device 600 may have a chip to chip (C2C) structure. The C2C structure may mean fabricating an upper chip including the cell region CELL on a first wafer, fabricating a lower chip including the peripheral circuit region PERI on a second wafer different from the first wafer, and then connecting the upper chip and the lower chip to each other using a bonding method. For example, the cell region CELL may be formed in the first semiconductor layer, and the peripheral circuit region PERI may be formed in the second semiconductor layer disposed below the first semiconductor layer. The bonding method may mean a method of electrically connecting a bonding metal formed on the uppermost metal layer of the upper chip including the cell region CELL and a bonding metal formed on the lowermost metal layer of the lower chip including the peripheral circuit region PERI to each other. In embodiments, when the bonding metal includes copper (Cu), the bonding method may be a Cu—Cu bonding method. In other embodiments, the bonding metal may include or may be formed of aluminum or tungsten.

In the memory device 600, each of the peripheral circuit region PERI and the cell region CELL may include a pad bonding region PA. The cell region CELL may further include the connection region CON and the memory cell region MEC.

The peripheral circuit region PERI may include a first substrate 610, an interlayer insulating layer 615, a plurality of circuit elements 620a, 620b, and 620c formed on the first substrate 610, first metal layers 630a, 630b, and 630c respectively connected to the plurality of circuit elements 620a, 620b, and 620c, and second metal layers 640a, 640b, and 640c respectively formed on the first metal layers 630a, 630b, and 630c. In an embodiment, the first metal layers 630a, 630b, and 630c may include or may be formed of tungsten, and the second metal layers 640a, 640b, and 640c may include or may be formed of copper.

In other embodiments, at least one metal layer may be further formed on the second metal layers 640a, 640b, and 640c. At least a part of the at least one metal layer formed on the second metal layers 640a, 640b, and 640c may include or may be formed of aluminum.

The interlayer insulating layer 615 may cover the plurality of circuit elements 620a, 620b, and 620c, the first metal layers 630a, 630b, and 630c, and the second metal layers 640a, 640b, and 640c. The interlayer insulating layer 615 may include or may be formed of silicon oxide, silicon nitride, or a combination thereof.

Lower bonding metals 671b and 672b may be arranged on the second metal layer 640b in a region overlapping the connection region CON of the peripheral circuit region PERI in the vertical direction (Z direction). In the connection region CON, the lower bonding metals 671b and 672b of the peripheral circuit region PERI may be electrically connected to the upper bonding metals 371b and 372b of the cell region CELL using the bonding method. The lower bonding metals 671*b* and 672*b* and the upper bonding metals 371*b* and 372*b* may include or may be formed of aluminum, copper, or tungsten.

The cell region CELL may include a second substrate 310 and a common source line 320. The gate stack GS including the plurality of gate lines GL and the plurality of conductive pad regions 112 connected to the plurality of gate lines GL may be disposed on the second substrate 310. A detailed configuration of a structure in the connection region CON and the memory cell region MEC in the cell region CELL is the same as that described with reference to FIG. 6.

In the memory cell region MEC, the channel structure 180 may be connected to upper bonding metals 371*c* and 372*c* through the bit line contact pad 194 and the bit line BL. The bit line BL may be electrically connected to a circuit element included in the peripheral circuit region PERI, for example, the circuit element 620*c* providing a page buffer 393 through upper bonding metals 371*c* and 372*c*. The upper bonding metals 371*c* and 372*c* may be connected to lower bonding metals 671*c* and 672*c* connected to the circuit element 620*c* of the page buffer 393.

In the connection region CON, each of the plurality of conductive pad regions 112 may extend in a direction parallel to an upper surface of the second substrate 310, and may be connected to the contact structure CTS through the metal silicide layer 118. In each of the plurality of contact structures CTS, the other end opposite to one end connected to the metal silicide layer 118 may be connected to the upper bonding metals 371*b* and 372*b*. The plurality of contact structures CTS may be connected to the peripheral circuit region PERI through the upper bonding metals 371*b* and 372*b* of the cell region CELL and the lower bonding metals 671*b* and 672*b* of the peripheral circuit region PERI.

Each of the contact structures CTS may be electrically connected to the circuit element 620*b* providing a row decoder 394 in the peripheral circuit region PERI. In embodiments, an operating voltage of the circuit element 620*b* providing the row decoder 394 may be different from an operating voltage of the circuit element 620*c* providing the page buffer 393. For example, the operating voltage of the circuit element 620*c* providing the page buffer 393 may be greater than the operating voltage of the circuit element 620*b* providing the row decoder 394.

A plurality of common source line contact plugs 380 may be arranged in the pad bonding region PA. Each of the plurality of common source line contact plugs 380 may be electrically connected to the common source line 320. Each of the plurality of common source line contact plugs 380 may include or may be formed of a metal, a metal compound, polysilicon, or a combination thereof. A metal layer 350*a* may be connected to the other end of the common source line contact plug 380 opposite to one end connected to the common source line 320. The metal layer 350*a* may be connected to upper metal patterns 371*a* and 372*a*. Each of the upper metal patterns 371*a* and 372*a* may be connected to a corresponding one of lower metal patterns 671*a*, 672*a*, and 673*a* of the peripheral circuit region PERI. The plurality of common source line contact plugs 380 may be included in the peripheral contact structure PTS described with reference to FIG. 6, and the plurality of common source line contact plugs 380 may be connected to peripheral transistors formed in the peripheral circuit region PERI.

A plurality of input/output pads 305 and 605 may be arranged in the pad bonding region PA. A lower insulating layer 601 covering a lower surface of the first substrate 610 may be formed below the first substrate 610, and a first input/output pad 605 may be formed on the lower insulating layer 601. The first input/output pad 605 may be connected to at least one of the plurality of circuit elements 620*a*, 620*b*, and 620*c* arranged in the peripheral circuit region PERI through the first input/output contact plug 603 penetrating the lower insulating layer 601 and the first substrate 610. An insulating layer 612 may be disposed between the first input/output contact plug 603 and the first substrate 610 and electrically separate the first input/output contact plug 603 from the first substrate 610.

An upper insulating layer 301 covering an upper surface of the second substrate 310 may be formed on the second substrate 310. A second input/output pad 305 may be disposed on the upper insulating layer 301. The second input/output pad 305 may be connected to at least one of the plurality of circuit elements 620*a*, 620*b*, and 620*c* arranged in the peripheral circuit region PERI through the second input/output contact plug 303.

The second input/output contact plug 303 may be disposed to be spaced apart from the second substrate 310 and the common source line 320. The second input/output pad 305 may not overlap the plurality of conductive pad regions 112 in the vertical direction (Z direction). The second input/output contact plug 303 may penetrate the interlayer insulating layer 315 and the upper insulating layer 301 and be connected to the second input/output pad 305.

In embodiments, any one of the first input/output pad 605 and the second input/output pad 305 may be omitted.

In the pad bonding region PA, each of the upper metal patterns 371*a* and 372*a* formed on the lowermost metal layer of the cell region CELL may be connected to a corresponding one of the lower metal patterns 671*a*, 672*a*, 273*a* formed on the uppermost metal layer of the peripheral circuit region PERI. The lower metal pattern 673*a* formed on the uppermost metal layer of the peripheral circuit region PERI may not be connected to a separate contact in the peripheral circuit region PERI. Similarly, in the pad bonding region PA, an upper metal pattern having the same shape as a lower metal pattern of the peripheral circuit region PERI may be formed on an upper metal layer of the cell region CELL in correspondence to a lower metal pattern formed on the uppermost metal layer of the peripheral circuit region PERI.

The lower bonding metals 671*b* and 672*b* may be formed on the second metal layer 640*b* of the connection region CON. The lower bonding metals 671*b* and 672*b* may be electrically connected to the upper bonding metals 371*b* and 372*b* of the cell region CELL using the bonding method.

In the memory cell region MEC, the upper metal pattern 392 may be disposed on the lowermost metal layer of the cell region CELL in correspondence to the lower bonding metals 651 and 652 formed on the uppermost metal layer of the peripheral circuit region PERI.

The memory device 600 may include a resistor RE12 included in the peripheral circuit (30 of FIG. 1). For example, the resistor RE12 may be formed in the pad bonding region PA. The resistor RE12 may include the plurality of gate patterns RGP, the plurality of resistance contact structures RCP formed to contact the gate pattern RGP, and the plurality of resistance conductive patterns RMP formed to contact the resistance contact structure RCP. The plurality of gate patterns RGP, the plurality of resistance contact structures RCP, and the plurality of resistance conductive patterns RMP of the resistor RE12 are substantially the same as the plurality of gate patterns RGP, the plurality of resistance contact structures RCP, and the plurality of resistance conductive patterns RMP described with reference to FIG. 6.

In addition, the resistor RE12 may include an upper metal pattern R371, an upper bonding metal R372, lower bonding metals R673 and R672, a second metal layer R640, and a first metal layer R630. FIG. 16 illustrates that the resistor RE12 includes the gate pattern RGP6 formed in the peripheral circuit region PERI, but aspects of the inventive concept is not limited thereto, and the resistor RE12 may not include the gate pattern RGP6 and may be connected to a peripheral transistor formed in the peripheral circuit region PERI through the second metal layer R640 or the first metal layer R630.

The plurality of resistance contact structures RCP may include a material different from that of the plurality of common source line contact plugs 380 and second input/output contact plugs 303. For example, the plurality of resistance contact structures RCP may include a material having a higher resistivity than that of the plurality of common source line contact plugs 380 and the second input/output contact plugs 303. Accordingly, the resistor RE12 may be formed to have a resistance value required by the peripheral circuit (30 in FIG. 1).

In an embodiment, the resistor RE12 may be modified to include characteristics of each of the resistors RE to RE9 described with reference to FIGS. 6 to 13 and formed in the memory device 600. For example, the resistor RE12 may include the doped region (DP of FIG. 7 or RDP of FIG. 8) formed on the substrate 301, the resistance transistor (RTR of FIG. 11 or RTR of FIG. 12) formed on the substrate 301, and the plurality of horizontal patterns (RHP of FIG. 13) and the plurality of vertical patterns (RVP of FIG. 13) formed on the plurality of resistance contact structures RCP.

The resistor RE12 of the memory device 600 according to aspects of the inventive concept may include the plurality of resistance contact structures RCP formed at a vertical level at which the plurality of channel structures 180 are formed. That is, the memory device 600 may include the plurality of resistance contact structures RCP overlapping the plurality of channel structures 180 in the horizontal direction of the second substrate 310, and thus the parasitic resistance of the resistor RE12 may be reduced and a separate horizontal pattern for implementing the resistor RE12 may not be formed. The memory device 600 according to aspects of the inventive concept may secure stability of a circuit operation and reduce its size.

FIGS. 17A to 17G are cross-sectional views sequentially illustrating a method of manufacturing the memory device 100 according to an embodiment of the inventive concept. In the embodiment, the method of manufacturing the memory device 100 illustrated in FIG. 6 will be described as an example.

Figure 17A:
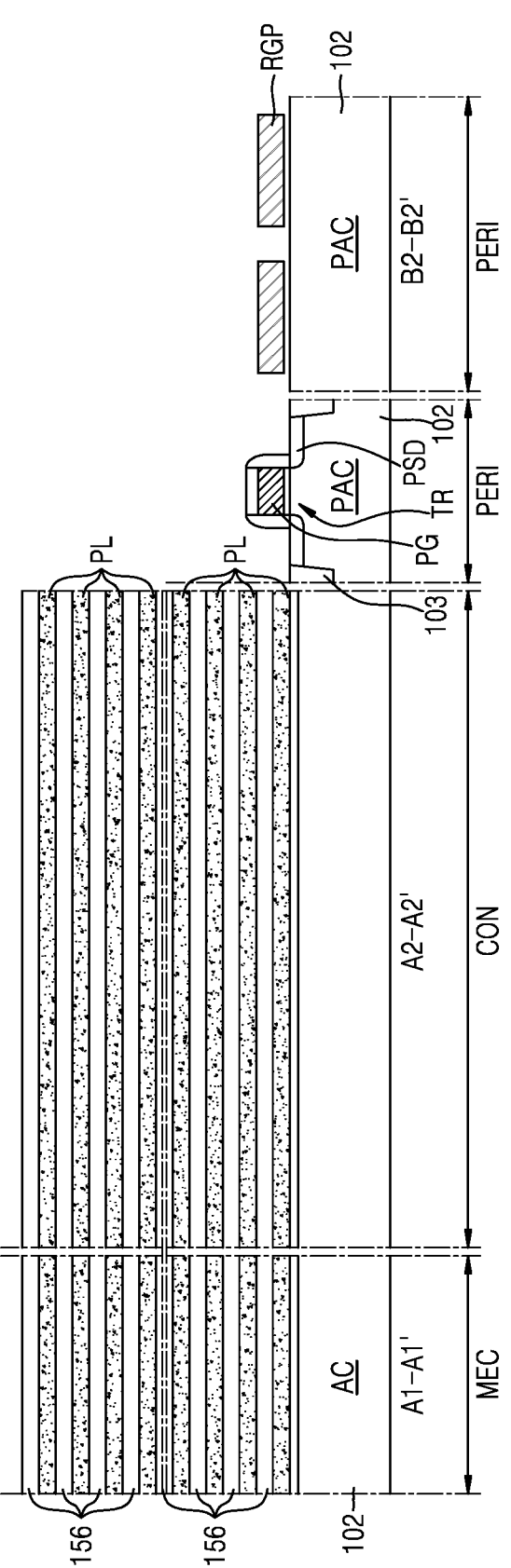
FIGS. 17A to 17G are cross-sectional views sequentially illustrating a method of manufacturing a memory device according to an embodiment of the inventive concept.

Referring to FIG. 17A, the active region AC may be defined in the memory cell region MEC of the substrate 102 and the peripheral active region PAC may be defined in the peripheral circuit region PERI. The peripheral active region PAC may be defined by the device isolation layer 103.

The plurality of insulating layers 156 and a plurality of sacrificial layers PL may be alternately stacked one by one on the memory cell region MEC and the connection region CON of the substrate 102, and the peripheral transistor TR and the plurality of resistance gate patterns RGP may be formed in the peripheral circuit region PERI. The plurality of sacrificial layers PL may include or may be formed of silicon nitride, silicon carbide, or polysilicon. Each of the plurality of sacrificial layers PL may serve to secure a space for forming the gate stack GS (see FIG. 17C) in a subsequent process.

Figure 17B:
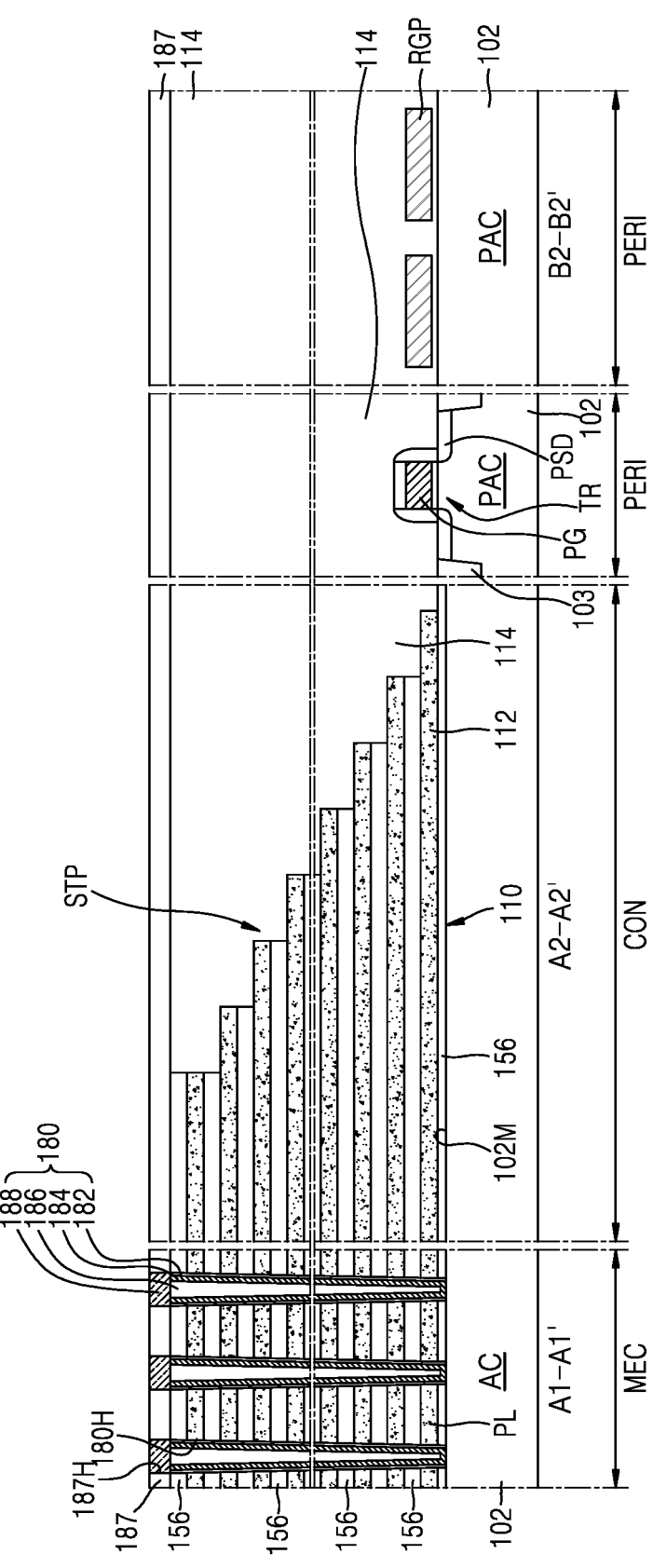

Referring to FIG. 17B, a part of each of the plurality of insulating layers 156 and the plurality of sacrificial layers PL may be removed so that the plurality of insulating layers 156 and the plurality of sacrificial layers PL form a stair type structure STP and then, the insulating layer 114 covering the stair type structure STP and the peripheral transistor TR may be formed at a surface of the substrate 102.

Thereafter, a plurality of lower channel holes 180H penetrating the plurality of insulating layers 156 and the plurality of sacrificial layers PL and extending in a vertical direction may be formed in the memory cell region MEC, and the gate dielectric layer 182, the channel region 184, and the filling insulating layer 186 may be formed in each of the plurality of lower channel holes 180H, and a plurality of lower channel hole filling structures may be formed.

Subsequently, an intermediate insulating layer 187 covering the plurality of lower channel hole filling structures, the stair type structure STP, and the insulating layer 114 may be formed in the memory cell region MEC, the connection region CON, and the peripheral circuit region PERI, a plurality of contact holes 187H may be formed in the intermediate insulating layer 187 to expose upper surfaces of the plurality of lower channel hole filling structures, and a plurality of drain regions 188 may be formed in the plurality of contact holes 187H to form the channel structure 180. The intermediate insulating layer 187 may be formed to have a planarized upper surface over the memory cell region MEC, the connection region CON, and the peripheral circuit region PERI.

Figure 17C:
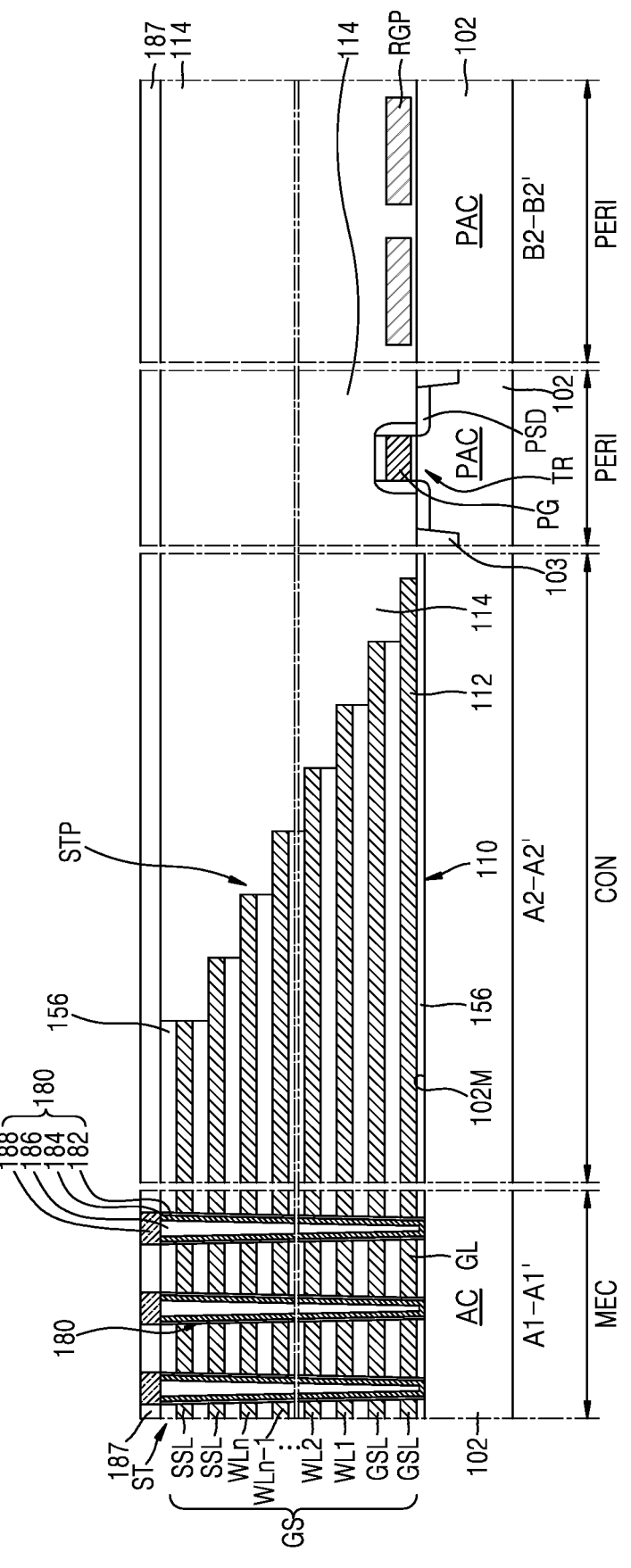

Referring to FIG. 17C, the plurality of word line cut regions (WLC of FIG. 4A) penetrating the plurality of insulating layers 156 and the plurality of sacrificial layers (PL of FIG. 17B) and exposing the substrate 102 may be formed and then, impurity ions may be injected into the substrate 102 through the plurality of word line cut regions WLC to form the plurality of common source regions, and the plurality of sacrificial layers (PL in FIG. 17B) may be substituted to the plurality of gate lines GL and the plurality of conductive pad regions 112. The plurality of conductive pad regions 112 in the connection region CON may constitute the stair-type connector 110.

In embodiments, in order to substitute the plurality of sacrificial layers PL to a plurality of lower word lines WLA, the plurality of sacrificial layers PL exposed through the plurality of word line cut regions WLC may be selectively removed to provide empty spaces between the plurality of insulating layers 156, and then the empty spaces may be filled with a conductive material to form the plurality of gate lines GL and the plurality of conductive pad regions 112.

Thereafter, as shown in FIG. 6, the insulating spacer 192 and the common source line CSL may be formed in each of the plurality of word line cut regions WLC to form the word line cut structure WCS. The insulating spacer 192 may include or may be formed of silicon oxide, silicon nitride, SiON, SiOCN, SiCN, or a combination thereof. The common source line CSL may include or may be formed of a metal such as tungsten, copper, or aluminum; a conductive metal nitride such as titanium nitride and tantalum nitride; a transition metal such as titanium, tantalum, etc.; or a combination thereof. In some embodiments, a metal silicide layer for reducing a contact resistance may be between the common source region 106 and the common source line CSL. The metal silicide layer may include or may be formed of cobalt silicide, but is not limited thereto. In some embodiments, when the common source line CSL is filled in the substrate 102, the plurality of word line cut regions WLC may be filled with only an insulating material, and a process of forming the common source line CSL may be omitted.

Figure 17D:
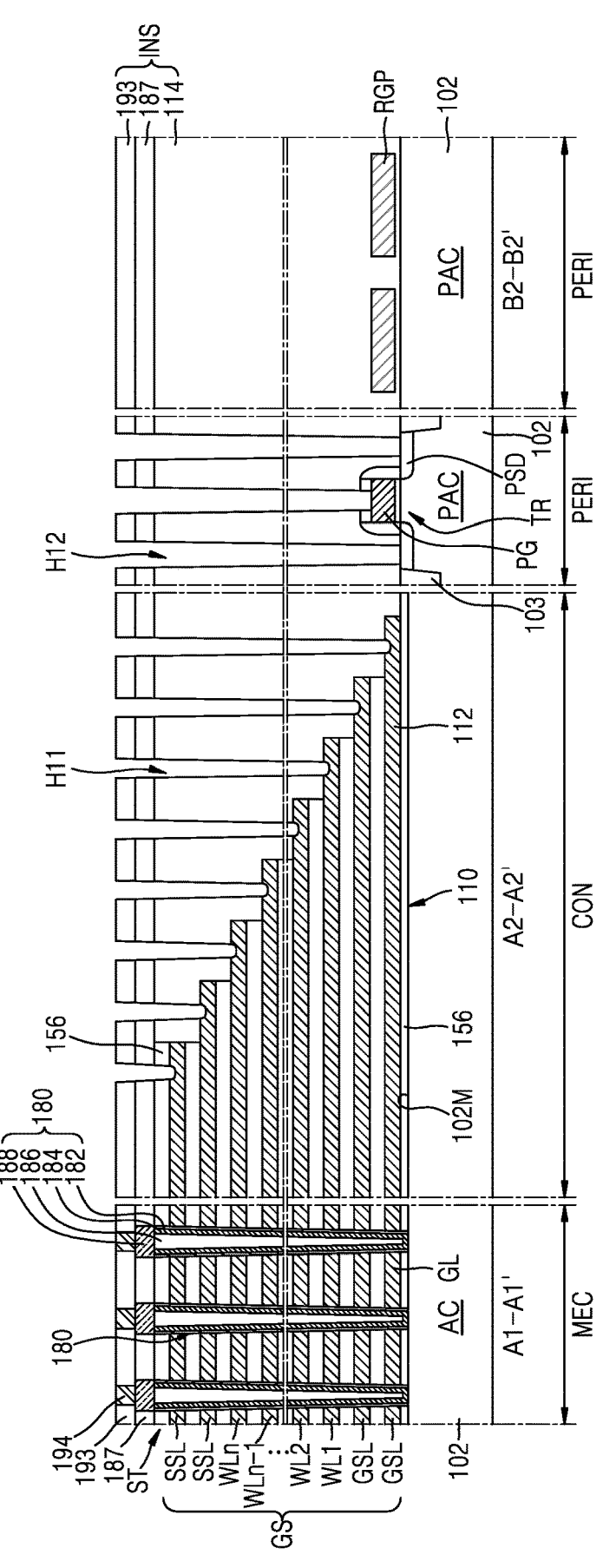

Referring to FIG. 17D, the upper insulating layer 193 may be formed on a resultant of FIG. 17C and then, the plurality of bit line contact pads 194 penetrating the upper insulating layer 193 and connected to the plurality of channel structures 180 may be formed in the memory cell region MEC. The insulating layer 114, the intermediate insulating layer 187, and the upper insulating layer 193 may constitute the insulating structure INS.

The insulating structure INS may be anisotropically etched in the connection region CON and the peripheral circuit region PERI by using a mask pattern as an etching mask to form a plurality of first contact holes H11 exposing the plurality of conductive pad regions 112 in the connection region CON and a plurality of second contact holes H12 exposing the peripheral gate PG and the peripheral source/drain region PSD on the peripheral circuit region PERI. The plurality of first contact holes H11 and the plurality of second contact holes H12 may be simultaneously formed.

Figure 17E:
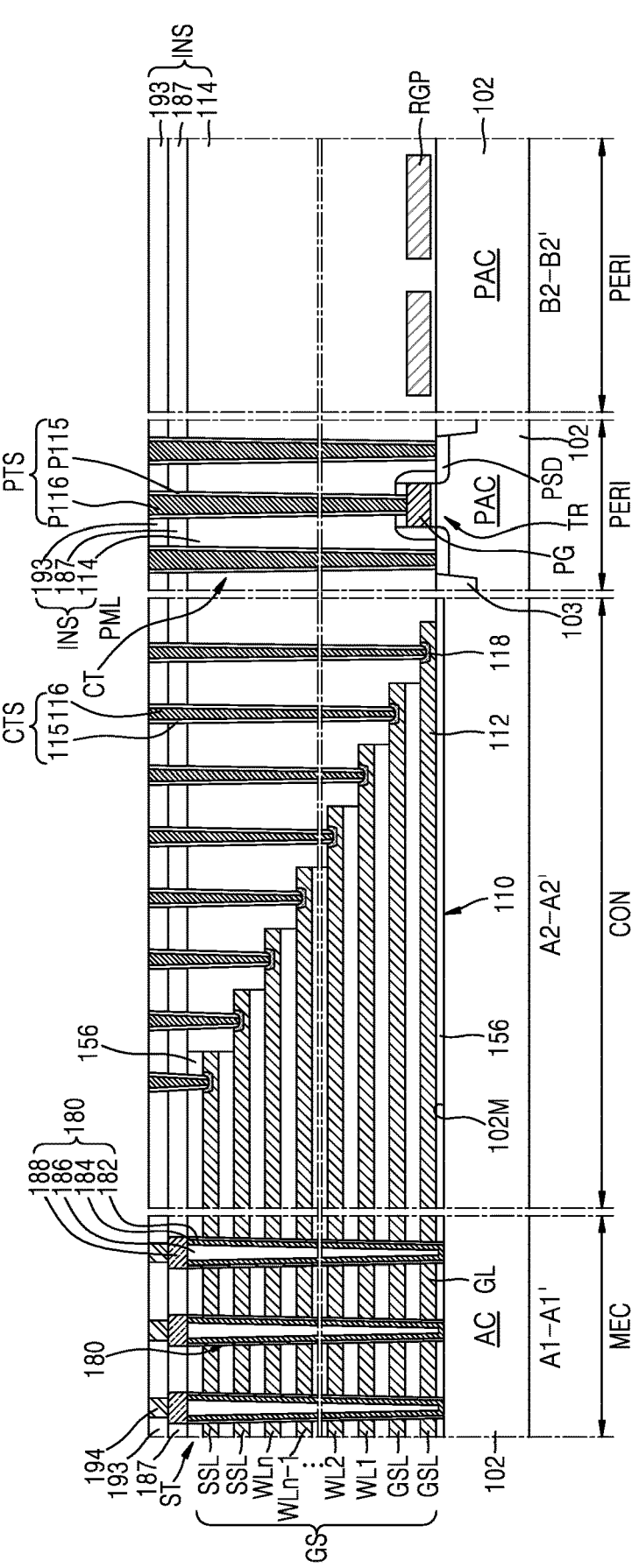

Referring to FIG. 17E, the contact structure CTS may be formed on the conductive pad region 112 exposed through each of the plurality of first contact holes H11 in the connection region CON. Also, the peripheral insulating plug P115 and the peripheral contact plug P116 may be sequentially formed in the plurality of second contact holes H12 on the peripheral circuit region PERI to form the peripheral contact structure PTS.

Figure 17F:
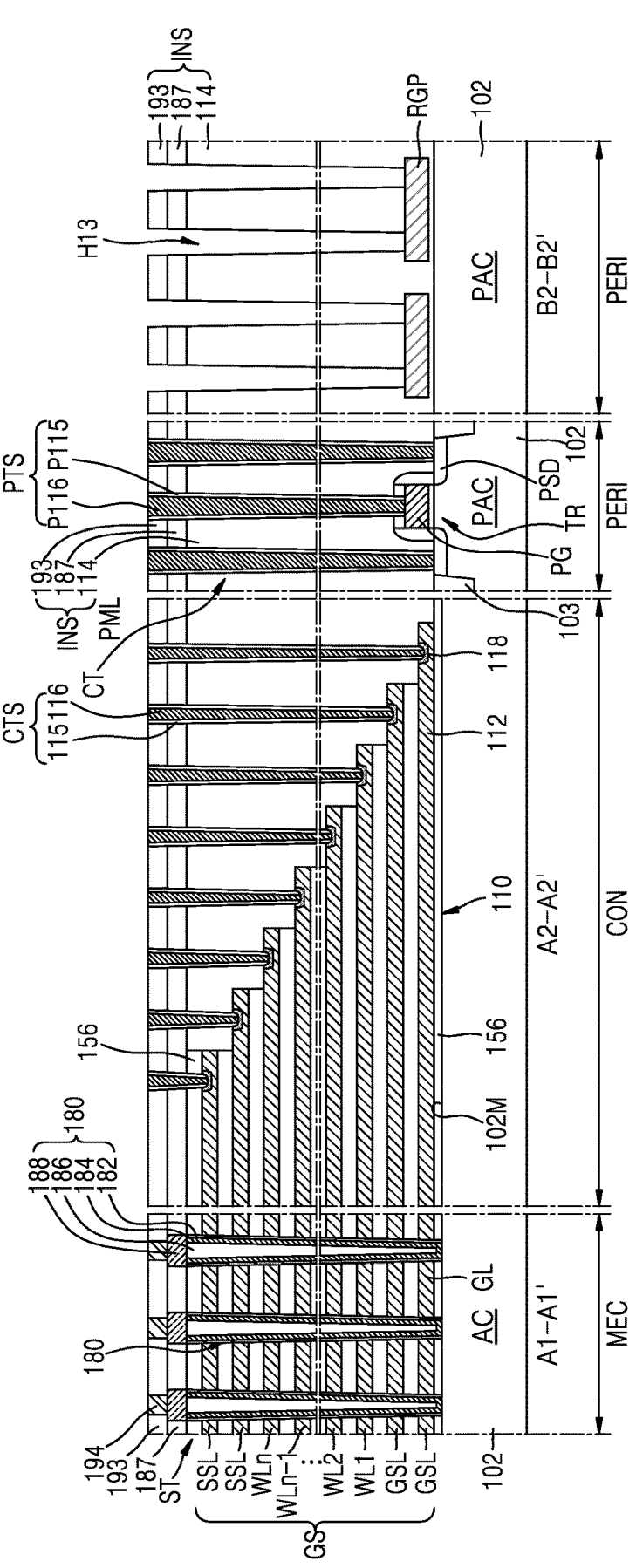

Referring to FIG. 17F, the insulating structure INS may be anisotropically etched on the peripheral circuit region PERI by using the mask pattern as the etching mask to form a plurality of third contact holes H13 exposing the plurality of resistance gate patterns RGP on the peripheral circuit region PERI. However, unlike illustrated in FIG. 17F, the plurality of third contact holes H13 may be formed simultaneously with the plurality of first contact holes H11 and the plurality of second contact holes H12.

Figure 17G:
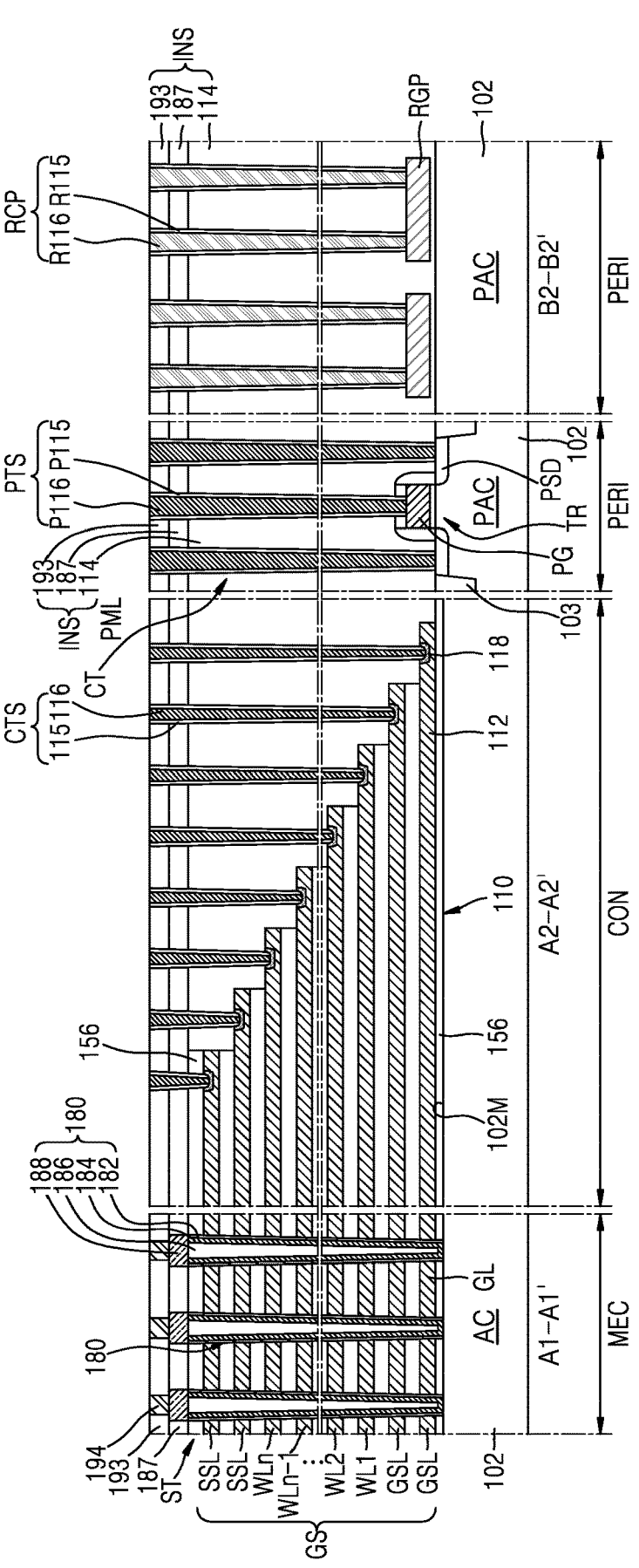

Referring to FIG. 17G, the resistance contact structure RCP may be formed on the plurality of resistance gate patterns RGP exposed through each of the plurality of third contact holes H13 in the peripheral circuit region PERI. For example, the resistance insulating plug R115 and the resistance contact plug R116 may be sequentially formed in the plurality of third contact holes H13 on the peripheral circuit region PERI to form the resistance contact structure RCP. In this case, the resistance contact plug R116 may include a material having a higher resistivity than that of the peripheral contact plug P116. However, unlike shown in FIG. 17G, the resistance contact structure RCP may be formed simultaneously with the peripheral contact structure PTS.

Thereafter, the plurality of resistance conductive patterns (RMP of FIG. 6) may be formed on the plurality of resistance contact structures RCP so as to be in contact with the plurality of resistance contact structures RCP, and the resistor (RE of FIG. 6) may be formed.

While aspects of the inventive concept have been particularly shown and described with reference to embodiments thereof, it will be understood that various changes in form and details may be made therein without departing from the spirit and scope of the following claims.

What is claimed is:

1. A memory device comprising:
a first substrate extending in a first direction and a second direction perpendicular to the first direction, the first substrate including a memory cell region, a connection region, and a first peripheral circuit region;

a second substrate, including a second peripheral circuit region, extending in the first direction and the second direction, the second substrate overlapping the first substrate in a third direction perpendicular to the first direction and the second direction;
a memory cell array disposed in the memory cell region and including a plurality of vertical channel structures extending in the third direction;
a peripheral circuit, including a plurality of transistors, disposed in the second peripheral circuit region;
a plurality of peripheral wiring layers disposed at a vertical level above the vertical channel structures, and electrically connected to the plurality of transistors; and
a resistor extending in the third direction through the first peripheral circuit region and the second peripheral circuit region,
wherein the resistor comprises a plurality of resistance contact structures overlapping the plurality of vertical channel structures in the first direction, and resistance conductive patterns disposed on and electrically connected to the plurality of resistance contact structures,
wherein a first peripheral wiring layer included in the plurality of peripheral wiring layers is electrically connected to the resistance conductive patterns, and
wherein a second peripheral wiring layer included in the plurality of peripheral wiring layers is not electrically connected to the resistance conductive patterns.

2. The memory device of claim 1, wherein the peripheral circuit comprises a peripheral transistor formed at a surface of the second substrate, and
wherein the resistor further comprises a plurality of resistance gate patterns formed at the same level in the third direction as a gate of the peripheral transistor.

3. The memory device of claim 2, further comprising:
a plurality of doped regions formed below the plurality of resistance gate patterns and formed inside the second substrate.

4. The memory device of claim 1, wherein the peripheral circuit comprises a peripheral transistor formed at a surface of the second substrate, and
wherein the resistor comprises a plurality of doped regions formed inside the second substrate.

5. The memory device of claim 1, wherein the plurality of resistance contact structures comprise a first resistance contact structure having an upper surface of a first width in the first direction, and a second resistance contact structure having an upper surface of a second width in the first direction, and
wherein the first width is greater than the second width.

6. The memory device of claim 1, wherein the resistance conductive patterns are in contact with upper surfaces of the plurality of resistance contact structures, and
wherein three or more resistance contact structures contact one resistance conductive pattern of the plurality of resistance conductive patterns.

7. The memory device of claim 1, wherein the resistor further comprises a resistance transistor formed on the second substrate, and
wherein a resistance contact structure of the plurality of resistance contact structures contacts a source/drain region of the resistance transistor.

8. The memory device of claim 7, wherein a signal turning off the resistance transistor is input to a gate of the resistance transistor.

9. The memory device of claim 1, wherein the resistor further comprises a resistance transistor formed on the second substrate, and wherein a resistance contact structure of the plurality of resistance contact structures contacts a gate of the resistance transistor.

10. The memory device of claim 1, wherein the resistor further comprises a plurality of horizontal patterns formed on a plurality of layers stacked on the plurality of resistance contact structures; and a plurality of vertical patterns connecting the plurality of horizontal patterns formed on different layers.

11. A memory device comprising:

a first substrate extending in a first direction and a second direction perpendicular to the first direction, the first substrate including a memory cell region, a connection region, and a first peripheral circuit region;

a second substrate, including a second peripheral circuit region, extending in the first direction and the second direction, the second substrate overlapping the first substrate in a third direction perpendicular to the first direction and the second direction;

a memory cell array disposed in the memory cell region;

a plurality of contact structures included in the connection region and extending in the third direction;

a plurality of peripheral wiring layers disposed on the plurality of contact structures, and electrically connected to a plurality of transistors included in the second peripheral circuit region via the plurality of contact structures;

a plurality of resistance contact structures extending in the third direction through the first peripheral circuit region and the second peripheral circuit region; and a plurality of resistance conductive patterns disposed on and electrically connected to the plurality of resistance contact structures, wherein a resistivity of a material included in the plurality of resistance contact structures is greater than a resistivity of a material included in the plurality of contact structures, and wherein at least one of the plurality of peripheral wiring layers is electrically connected to at least one of the plurality of resistance conductive patterns.

12. The memory device of claim 11, wherein the second peripheral circuit region includes a peripheral transistor formed at a surface of the second substrate, and wherein the plurality of resistance contact structures contacts a plurality of resistance gate patterns formed at the same level in the third direction as a gate of the peripheral transistor.

13. The memory device of claim 11, wherein the plurality of resistance contact structures contacts a plurality of resistance gate patterns formed on the second substrate.

14. The memory device of claim 11, wherein the plurality of resistance contact structures contacts a plurality of doped regions formed in the second substrate.

15. The memory device of claim 11, wherein the plurality of resistance contact structures comprise a first resistance contact structure having an upper surface of a first width in the first direction, and a second resistance contact structure having an upper surface of a second width in the first direction, and wherein the first width is greater than the second width.

16. The memory device of claim 11, wherein the second peripheral circuit region includes a resistance transistor, and wherein a resistance contact structure of the plurality of resistance contact structures contacts a source/drain region of the resistance transistor.

17. The memory device of claim 11, wherein the second peripheral circuit region includes a resistance transistor, and wherein a resistance contact structure of the plurality of resistance contact structures contacts a gate of the resistance transistor.

18. A memory device comprising:

a first substrate extending in a first direction and a second direction perpendicular to the first direction, the first substrate including a memory cell region, a peripheral circuit region, and a connection region disposed between the memory cell region and the peripheral circuit region;

a memory cell array disposed in the memory cell region and including a plurality of vertical channel structures extending in a third direction perpendicular to the first direction and the second direction;

a peripheral circuit disposed in the peripheral circuit region;

a plurality of peripheral transistors disposed in the peripheral circuit region;

a plurality of peripheral contact structures disposed in the peripheral circuit region and extending in the third direction;

a resistor disposed in the peripheral circuit region and including a plurality of resistance contact structures extending in the third direction and overlapping the plurality of vertical channel structures and peripheral contact structures in the first direction; and a plurality of resistance conductive patterns disposed on the plurality of resistance contact structures and electrically connecting each of the plurality of resistance contact structures to each other, wherein a resistivity of a material included in the plurality of resistance contact structures is greater than a resistivity of a material included in the plurality of peripheral contact structures.

19. The memory device of claim 18, wherein the plurality of vertical channel structures comprise a plurality of upper channel structures and a plurality of lower channel structures disposed, at a level in the third direction lower than the plurality of upper channel structures, and wherein the plurality of resistance contact structures comprise a plurality of upper resistance contact structures overlapping the plurality of upper channel structures in the first direction, and a plurality of lower resistance contact structures overlapping with the plurality of lower channel structures in the first direction.

20. The memory device of claim 18, wherein the resistor further comprises a plurality of resistance gate patterns formed at the same level in the third direction as a gate of a peripheral transistor of the plurality of peripheral transistors.

* * * * *